(12) United States Patent
Yamazaki et al.

(10) Patent No.: US 7,880,167 B2
(45) Date of Patent: Feb. 1, 2011

(54) METHOD FOR MANUFACTURING AN ELECTRO-OPTICAL DEVICE OR ELECTROLUMINESCENCE DISPLAY DEVICE

(75) Inventors: Shunpei Yamazaki, Tokyo (JP); Jun Koyama, Kanagawa (JP); Kunitaka Yamamoto, Kanagawa (JP); Toshimitsu Konuma, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

(21) Appl. No.: 11/085,077

(22) Filed: Mar. 22, 2005

(65) Prior Publication Data

US 2005/0206313 A1 Sep. 22, 2005

Related U.S. Application Data

(62) Division of application No. 09/580,485, filed on May 30, 2000, now Pat. No. 7,288,420.

(30) Foreign Application Priority Data

Jun. 4, 1999 (JP) ................................. 11-158813

(51) Int. Cl.
H01L 21/84 (2006.01)
H01L 29/49 (2006.01)
H01L 29/40 (2006.01)

(52) U.S. Cl. .................... 257/59; 257/72; 257/761; 257/E21.414; 257/E29.151

(58) Field of Classification Search ............... 257/384, 257/642, 40, 59, 72, 61, E21.414, E29.151
See application file for complete search history.

(56) References Cited

U.S. PATENT DOCUMENTS

| 4,356,429 | A | 10/1982 | Tang |
| 4,530,750 | A | 7/1985 | Aisenberg et al. |
| 4,539,507 | A | 9/1985 | VanSlyke et al. |
| 4,720,432 | A | 1/1988 | VanSlyke et al. |

(Continued)

FOREIGN PATENT DOCUMENTS

CN 1131092 9/1996

(Continued)

OTHER PUBLICATIONS

European Search Report mailed Jul. 29, 2005 Application No. EP 00 11 2013.

(Continued)

*Primary Examiner*—Zandra Smith
*Assistant Examiner*—Tsz K Chiu
(74) *Attorney, Agent, or Firm*—Nixon Peabody LLP; Jeffrey L. Costellia

(57) ABSTRACT

An object of the present invention is to provide an EL display device having high operation performance and reliability.

A third passivation film 45 is disposed under the EL element 203 comprising a pixel electrode (anode) 46, an EL layer 47 and a cathode 48, and diffusion of alkali metals from the EL element 203 formed by ink jet method into TFTs is prevented. Further, the third passivation film 45 prevents penetration of moisture and oxygen from the TFTs, and suppress degradation of the EL element 203 by dispersing the heat generated by the EL element 203.

12 Claims, 20 Drawing Sheets

U.S. PATENT DOCUMENTS

| | | | |
|---|---|---|---|
| 4,759,610 A * | 7/1988 | Yanagisawa | 349/162 |
| 4,769,292 A | 9/1988 | Tang et al. | |
| 4,885,211 A | 12/1989 | Tang et al. | |
| 4,950,950 A | 8/1990 | Perry et al. | |
| 4,975,338 A | 12/1990 | Kageyama et al. | |
| 5,003,221 A | 3/1991 | Shimizu | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,617 A | 10/1991 | Maskasky | |
| 5,073,446 A | 12/1991 | Scozzafava et al. | |
| 5,107,175 A | 4/1992 | Hirano et al. | |
| 5,124,204 A | 6/1992 | Yamashita et al. | |
| 5,151,629 A | 9/1992 | VanSlyke | |
| 5,177,577 A * | 1/1993 | Taniguchi et al. | 257/59 |
| 5,189,405 A | 2/1993 | Yamashita et al. | |
| 5,217,700 A | 6/1993 | Kurihara et al. | |
| 5,218,464 A * | 6/1993 | Hiroki et al. | 349/48 |
| 5,247,190 A | 9/1993 | Friend et al. | |
| 5,250,835 A | 10/1993 | Izawa | |
| 5,270,267 A * | 12/1993 | Ouellet | 438/597 |
| 5,276,380 A | 1/1994 | Tang | |
| 5,294,869 A | 3/1994 | Tang et al. | |
| 5,294,870 A | 3/1994 | Tang et al. | |
| 5,338,364 A | 8/1994 | Kurihara et al. | |
| 5,399,502 A | 3/1995 | Friend et al. | |
| 5,429,884 A | 7/1995 | Namiki et al. | |
| 5,438,241 A * | 8/1995 | Zavracky et al. | 315/169.3 |
| 5,477,357 A * | 12/1995 | Suzuki et al. | |
| 5,482,896 A | 1/1996 | Tang | |
| 5,495,121 A * | 2/1996 | Yamazaki et al. | |
| 5,496,597 A | 3/1996 | Soininen et al. | |
| 5,530,269 A | 6/1996 | Tang | |
| 5,552,668 A | 9/1996 | Hirose et al. | |
| 5,641,991 A | 6/1997 | Sakoh | |
| 5,643,826 A | 7/1997 | Ohtani et al. | |
| 5,650,640 A | 7/1997 | Stafford et al. | |
| 5,668,379 A | 9/1997 | Ono et al. | |
| 5,674,304 A | 10/1997 | Fukada et al. | |
| 5,680,165 A | 10/1997 | Takizawa et al. | |
| 5,680,185 A | 10/1997 | Kobayashi et al. | |
| 5,684,365 A | 11/1997 | Tang et al. | |
| 5,686,360 A | 11/1997 | Harvey, III et al. | |
| 5,688,551 A * | 11/1997 | Littman et al. | 427/64 |
| 5,693,956 A | 12/1997 | Shi et al. | |
| 5,717,224 A | 2/1998 | Zhang | |
| 5,747,930 A | 5/1998 | Utsugi | |
| 5,757,126 A | 5/1998 | Harvey, III et al. | |
| 5,771,562 A | 6/1998 | Harvey, III et al. | |
| 5,811,177 A | 9/1998 | Shi et al. | |
| 5,821,003 A | 10/1998 | Uemura et al. | |
| 5,824,374 A * | 10/1998 | Bradley, Jr. et al. | 427/555 |
| 5,838,338 A | 11/1998 | Olson | |
| 5,839,456 A | 11/1998 | Han | |
| 5,853,905 A | 12/1998 | So et al. | |
| 5,882,761 A | 3/1999 | Kawami et al. | |
| 5,885,498 A * | 3/1999 | Matsuo et al. | 252/583 |
| 5,889,459 A | 3/1999 | Hattori et al. | |
| 5,893,730 A * | 4/1999 | Yamazaki et al. | 438/166 |
| 5,923,962 A | 7/1999 | Ohtani et al. | |
| 5,929,487 A | 7/1999 | Fukada et al. | |
| 5,952,708 A | 9/1999 | Yamazaki | |
| 5,952,778 A | 9/1999 | Haskal et al. | |
| 5,953,084 A | 9/1999 | Shimada et al. | |
| 5,962,962 A | 10/1999 | Fujita et al. | |
| 5,989,945 A | 11/1999 | Yudasaka et al. | |
| 5,990,491 A | 11/1999 | Zhang | |
| 5,990,542 A * | 11/1999 | Yamazaki | |
| 5,990,615 A | 11/1999 | Sakaguchi et al. | |
| 6,028,325 A | 2/2000 | Yamazaki | |
| 6,052,162 A | 4/2000 | Shimada et al. | |
| 6,057,647 A * | 5/2000 | Kurosawa et al. | 315/169.3 |
| 6,072,278 A | 6/2000 | Keyser et al. | |
| 6,097,452 A | 8/2000 | Shimada et al. | |
| 6,097,459 A * | 8/2000 | Shimada et al. | 349/113 |
| 6,100,954 A * | 8/2000 | Kim et al. | |
| 6,114,183 A | 9/2000 | Hamada et al. | |
| 6,114,715 A | 9/2000 | Hamada | |
| 6,115,090 A | 9/2000 | Yamazaki | |
| 6,146,225 A | 11/2000 | Sheats et al. | |
| 6,150,187 A | 11/2000 | Zyung et al. | |
| 6,150,668 A * | 11/2000 | Bao et al. | 257/40 |
| 6,169,293 B1 | 1/2001 | Yamazaki | |
| 6,188,176 B1 | 2/2001 | Nakaya et al. | |
| 6,194,837 B1 * | 2/2001 | Ozawa | 315/169.1 |
| 6,195,138 B1 | 2/2001 | Shimada et al. | |
| 6,198,217 B1 | 3/2001 | Suzuki et al. | |
| 6,198,220 B1 | 3/2001 | Jones et al. | |
| 6,239,470 B1 | 5/2001 | Yamazaki | |
| 6,243,155 B1 * | 6/2001 | Zhang et al. | |
| 6,246,179 B1 * | 6/2001 | Yamada | |
| 6,251,712 B1 | 6/2001 | Tanaka et al. | |
| 6,268,631 B1 | 7/2001 | Fukada et al. | |
| 6,268,695 B1 | 7/2001 | Affinito | |
| 6,268,842 B1 | 7/2001 | Yamazaki et al. | |
| 6,274,887 B1 | 8/2001 | Yamazaki et al. | |
| 6,278,132 B1 | 8/2001 | Yamazaki et al. | |
| 6,283,578 B1 | 9/2001 | Popall et al. | |
| 6,291,837 B1 | 9/2001 | Nakajima et al. | |
| 6,303,963 B1 * | 10/2001 | Ohtani et al. | 257/350 |
| 6,310,667 B1 * | 10/2001 | Nakayoshi et al. | |
| 6,316,810 B1 | 11/2001 | Yamazaki et al. | |
| 6,335,716 B1 | 1/2002 | Yamazaki et al. | |
| 6,337,492 B1 | 1/2002 | Jones et al. | |
| 6,359,384 B1 | 3/2002 | Nakaya et al. | |
| 6,359,606 B1 | 3/2002 | Yudasaka | |
| 6,369,495 B2 | 4/2002 | Codama et al. | |
| 6,380,672 B1 * | 4/2002 | Yudasaka | |
| 6,413,645 B1 | 7/2002 | Graff et al. | |
| 6,433,851 B2 | 8/2002 | Shimada et al. | |
| 6,441,468 B1 | 8/2002 | Yamazaki | |
| 6,445,059 B1 | 9/2002 | Yamazaki | |
| 6,462,722 B1 | 10/2002 | Kimura et al. | |
| 6,501,097 B1 | 12/2002 | Zhang | |
| 6,512,504 B1 * | 1/2003 | Yamauchi et al. | |
| 6,522,315 B2 * | 2/2003 | Ozawa et al. | 345/92 |
| 6,531,713 B1 | 3/2003 | Yamazaki | |
| 6,545,424 B2 | 4/2003 | Ozawa | |
| 6,593,591 B2 | 7/2003 | Yudasaka et al. | |
| 6,593,990 B1 | 7/2003 | Yamazaki | |
| 6,605,497 B2 | 8/2003 | Yamazaki et al. | |
| 6,618,029 B1 * | 9/2003 | Ozawa | |
| 6,642,544 B1 | 11/2003 | Hamada et al. | |
| 6,642,651 B2 | 11/2003 | Yudasaka | |
| 6,730,966 B2 | 5/2004 | Koyama | |
| 6,787,887 B2 | 9/2004 | Yamazaki | |
| 6,794,681 B2 | 9/2004 | Nakajima et al. | |
| 6,800,873 B2 | 10/2004 | Zhang | |
| 6,885,148 B2 | 4/2005 | Yudasaka | |
| 6,888,160 B1 | 5/2005 | Nakajima et al. | |
| 6,890,805 B2 | 5/2005 | Yamazaki et al. | |
| 6,927,826 B2 | 8/2005 | Yamazaki | |
| 7,034,381 B2 | 4/2006 | Yamazaki | |
| 7,102,164 B2 | 9/2006 | Zhang | |
| 7,141,462 B2 | 11/2006 | Nakajima et al. | |
| 7,190,116 B2 * | 3/2007 | Kobayashi et al. | 313/512 |
| 7,202,551 B2 | 4/2007 | Yamazaki | |
| 7,413,937 B2 | 8/2008 | Yamazaki | |
| 7,423,291 B2 | 9/2008 | Zhang | |
| 2001/0001050 A1 | 5/2001 | Miyashita et al. | |
| 2001/0002144 A1 | 5/2001 | Yamazaki | |
| 2001/0002703 A1 * | 6/2001 | Koyama | |
| 2001/0026125 A1 * | 10/2001 | Yamazaki et al. | |
| 2002/0041926 A1 | 4/2002 | Miyashita et al. | |

| | | | |
|---|---|---|---|
| 2002/0047120 A1* | 4/2002 | Inukai | |
| 2002/0074547 A1 | 6/2002 | Yudasaka et al. | |
| 2002/0075422 A1 | 6/2002 | Kimura et al. | |
| 2002/0079484 A1 | 6/2002 | Yamazaki et al. | |
| 2002/0097363 A1 | 7/2002 | Yudasaka | |
| 2002/0100908 A1 | 8/2002 | Yudasaka et al. | |
| 2002/0136823 A1 | 9/2002 | Miyashita et al. | |
| 2002/0155215 A1 | 10/2002 | Miyashita et al. | |
| 2002/0179906 A1 | 12/2002 | Yudasaka et al. | |
| 2003/0054186 A1 | 3/2003 | Miyashita et al. | |
| 2003/0134519 A1 | 7/2003 | Yudasaka et al. | |
| 2003/0151568 A1 | 8/2003 | Ozawa | |
| 2003/0193493 A1 | 10/2003 | Ozawa | |
| 2004/0008311 A1 | 1/2004 | Yudasaka | |
| 2005/0041122 A1 | 2/2005 | Yamazaki et al. | |
| 2005/0042477 A1 | 2/2005 | Miyashita et al. | |
| 2005/0170096 A1 | 8/2005 | Yudasaka | |
| 2005/0189592 A1 | 9/2005 | Yamazaki et al. | |
| 2005/0197031 A1 | 9/2005 | Yamazaki et al. | |
| 2005/0208863 A1 | 9/2005 | Yamazaki et al. | |
| 2005/0264740 A1 | 12/2005 | Yamazaki | |

FOREIGN PATENT DOCUMENTS

| | | |
|---|---|---|
| EP | 0 684 753 | 11/1985 |
| EP | 0 491 521 | 6/1992 |
| EP | 0 684 753 | 11/1995 |
| EP | 0 702 075 A1 | 3/1996 |
| EP | 0 709 200 A1 | 5/1996 |
| EP | 0 717 445 A2 | 6/1996 |
| EP | 0 717 446 A2 | 6/1996 |
| EP | 0751699 A2 | 1/1997 |
| EP | 0762184 A1 | 3/1997 |
| EP | 0 776 147 A1 | 5/1997 |
| EP | 0 781 075 A1 | 6/1997 |
| EP | 0855614 A1 | 7/1998 |
| EP | 0862156 A1 | 9/1998 |
| EP | 0 880 303 A1 | 11/1998 |
| EP | 0 892 590 A2 | 1/1999 |
| EP | 0 932 137 A1 | 7/1999 |
| EP | 0935229 A1 | 8/1999 |
| EP | 0 940 797 A1 | 9/1999 |
| EP | 0 961 525 | 12/1999 |
| EP | 0 999 595 A2 | 5/2000 |
| EP | 1321797 A2 | 6/2003 |
| EP | 1365276 A2 | 11/2003 |
| EP | 1365443 A2 | 11/2003 |
| EP | 1367431 A2 | 12/2003 |
| EP | 1445793 A2 | 8/2004 |
| EP | 1450412 A2 | 8/2004 |
| EP | 1 505 648 A2 | 2/2005 |
| EP | 1 505 649 A2 | 2/2005 |
| EP | 1505650 A2 | 2/2005 |
| EP | 1505651 A2 | 2/2005 |
| EP | 1505652 A2 | 2/2005 |
| EP | 2090926 A1 | 8/2009 |
| JP | 52-122092 | 10/1977 |
| JP | 56-013184 A | 2/1981 |
| JP | 62-90260 | 4/1987 |
| JP | 62-180988 | 8/1987 |
| JP | 63-168999 | 7/1988 |
| JP | 01-186589 | 7/1989 |
| JP | 01-320769 | 12/1989 |
| JP | 02-167751 A | 6/1990 |
| JP | 02-265194 | 10/1990 |
| JP | 04-068318 A | 3/1992 |
| JP | 05-089959 A | 4/1993 |
| JP | 05-101885 A | 4/1993 |
| JP | 05-11 6297 | 5/1993 |
| JP | 05-121172 | 5/1993 |
| JP | 05-152400 | 6/1993 |
| JP | 06-177386 A | 6/1994 |
| JP | 06-295788 | 10/1994 |
| JP | 06-310279 A | 11/1994 |
| JP | 07-014678 | 1/1995 |
| JP | 07-14678 | 1/1995 |
| JP | 05152400 * | 1/1995 |
| JP | 7-130652 | 5/1995 |
| JP | 07-161474 A | 6/1995 |
| JP | 8-78159 | 3/1996 |
| JP | 8-078519 | 3/1996 |
| JP | 8-234683 | 9/1996 |
| JP | 8-241048 | 9/1996 |
| JP | 08-290647 | 11/1996 |
| JP | 8-330602 | 12/1996 |
| JP | 09-017572 A | 1/1997 |
| JP | 9-148066 | 6/1997 |
| JP | 09-166788 A | 6/1997 |
| JP | 09-223804 A | 8/1997 |
| JP | 10-12377 | 1/1998 |
| JP | 10-020342 A | 1/1998 |
| JP | 10-92576 | 4/1998 |
| JP | 10-134961 | 5/1998 |
| JP | 10-172762 A | 6/1998 |
| JP | 10-173196 A | 6/1998 |
| JP | 10-189252 | 7/1998 |
| JP | 10-189525 | 7/1998 |
| JP | 10-214043 | 8/1998 |
| JP | 10-223903 A | 8/1998 |
| JP | 10-253989 A | 9/1998 |
| JP | 10-261487 A | 9/1998 |
| JP | 10-268360 * | 10/1998 |
| JP | 10-270363 | 10/1998 |
| JP | 10-275682 | 10/1998 |
| JP | 10-303427 A | 11/1998 |
| JP | 10-319872 | 12/1998 |
| JP | 11-024604 | 1/1999 |
| JP | 11-024606 | 1/1999 |
| JP | 11-026155 A | 1/1999 |
| JP | 11-074073 | 3/1999 |
| JP | 11-087068 | 3/1999 |
| JP | 11-087726 A | 3/1999 |
| JP | 11-087732 | 3/1999 |
| JP | 11-095687 | 4/1999 |
| JP | 11-097174 A | 4/1999 |
| JP | 11-111993 A | 4/1999 |
| JP | 11-112002 | 4/1999 |
| JP | 11-119262 | 4/1999 |
| JP | 11-121760 A | 4/1999 |
| JP | 11-133405 A | 5/1999 |
| JP | 11-135264 | 5/1999 |
| JP | 11-143379 | 5/1999 |
| JP | 3053848 A | 6/2000 |
| JP | 2000-340798 | 12/2000 |
| JP | 2001-343933 | 12/2001 |
| JP | 2002-149112 | 5/2002 |
| KR | 90-9055 | 5/1990 |
| KR | 1998081742 A | 11/1998 |
| WO | WO 90/13148 | 11/1990 |
| WO | WO-95/25149 | 9/1995 |
| WO | WO-97/43689 | 11/1997 |
| WO | WO-98/12689 | 3/1998 |
| WO | WO98/24272 | 6/1998 |
| WO | WO 99/08324 | 2/1999 |
| WO | WO99/10862 | 3/1999 |

OTHER PUBLICATIONS

Tsutsui et al., "Electroluminescence in Organic Thin Films", Photochemical Processes in Organized Molecular Systems, 1991, pp. 437-450.

Tsutsui et al., "High Quantum Efficiency in Organic Light-Emitting Devices with Iridium-Complex as a Triplet Emissive Center", Japanese Journal of Applied Physics, vol. 38, Part 2, No. 12B, Dec.15, 1999, pp. L1502-L1504.

Schenk et al., "Polymers for Light Emitting Diodes", EuroDisptay '99 Proceedings, pp. 33-37, Sep. 6-9, 1999.

Nagakura et al., "Iwanami Science and Chemistry Dictionary", p. 619, Feb. 20, 1998, (Iwanami Rikagaku Jiten), 5$^{th}$ Edition.

Office Action from Japanese Patent Office (Application No. 2003-008554; J6900), Dated Jan. 22, 2008.

Office Action from Japanese Patent Office (Application No. 2003-008606; J6903), Dated Feb. 5, 2008.

Office Action (Application No. 00112013.8;EP4213) Dated Jul. 6, 2009.

Shimoda et al., "Multicolor Pixel Patterning of Light-Emitting Polymers by Ink-Jet Printing", SID 99 Digest, pp. 376-379.

Tsutsu et al., "Electroluminescence in Organic Thin Films", Photochemical Processes in Organized Molecular Systems, 1991, pp. 437-450.

Baldo et al., "Highly Efficient Phosphorescent Emission From Organic Electroluminescent Devices", Nature vol. 395, Sep. 10, 1998, pp. 151-154.

Baldo et al., "Very High-Efficiency Green Organic Light-Emitting Devices Based on Electrophosphorescence", Applied Physics Letters, vol. 75, No. 1, Jul. 5, 1999, pp. 4-6.

Tsutsui et al., High Quantum Efficiency in Organic Light-Emitting Devices with Iridium-Complex as a Triplet Emissive Center, Japanese Journal of Applied Physics, vol. 38, Part 12B, Dec. 15, 1999, pp. L1502-L1504.

U.S. Appl. No. 09/050,182, filed Mar. 26, 1998 (English Specification with Drawings and Pending Claims).

U.S. Appl. No. 09/528,113 filed Mar. 17, 2000 "Electro-Optical Device and Manufacturing Method Thereof" (Japanese Specification with Verified Translation).

U.S. Appl. No. 09/724,387 filed Nov. 28, 2000.

U.S. Appl. No. 09/725,798 filed Nov. 29, 2000 "Electric Device" (English Specification).

Schenk et al., "Polymers for Light Emitting Diodes", EuroDisplay '99 Proceedings, pp. 33-37.

Nagakura et al., "Iwanami Science and Chemistry Dictionary", p. 619, 1998, (Iwanami Rikagaku Jiten), 5th Edition.

Inventor: Yamazaki et al., U.S. Appl. No. 09/587,369, 92 pages, Filed: Jun. 2, 2000, Specification and Drawings.

Inventor: Yamazaki et al., U.S. Appl. No. 09/578,895, 93 pages, Filed: May 26, 2000, Specification and Drawings.

Inventor: Yamazaki et al., U.S. Appl. No. 09/680,492, 98 pages, Filed: Oct. 6, 2000, Specification and Drawings.

Shimoda et at., "Technology for Active Matrix Light Emitting Polymer Displays", pp. 107-110, Dec. 5-8, 1999, IEDM Technical Digest, Washington, DC.

Kimura et al., "TFT-LEPD with Image Uniformity by Area Ratio Gray Scale", pp. 71-74, Sep. 6-9, 1999, EuroDisplay '99, The 19th International Display Research Conference, Late-news Papers.

Kido et al White-Light-Emitting Organic Electroluminescent Device Using Lanthanide Complexes' pp. L394-L396, Mar. 15, 1996, Japanese Journal of Applied Physics, vol. 35, Part 2, No. 3B.

Specification and Drawings of U.S. Appl. No. 09/587,369, "Method for Manufacturing an Electro-Optical Device".

U.S. Appl. No. 10/337,886, filed Jan. 8, 2003 (Divisional of U.S. Appl. No. 09/924,846) Semiconductor Device and Manufacturing Method Therefor) (740756-2575).

U.S. Appl. No. 09/528,113, filed Mar. 17, 2000.

Office Action; Patent Office of the Peoples Republic of China, Patent Application No. 001222635; Nov. 21, 2003; pp. 1-3.

* cited by examiner

METHOD FOR MANUFACTURING AN ELECTRO-OPTICAL DEVICE OR ELECTROLUMINESCENCE DISPLAY DEVICE

BACKGROUND OF THE INVENTION

1. Field of the Invention

The present invention relates to an electro-optical device, typically an EL (electroluminescence) display device formed by a semiconductor element (an element using a semiconductor thin film) made on a substrate, and to electronic equipment (an electronic device) having the electro-optical device as a display (also referred to as a display portion). In particular, the present invention relates to a manufacturing method thereof.

2. Description of the Related Art

Techniques of forming a TFT on a substrate have been widely progressing in recent years, and developments of applications to an active matrix type display device are advancing. In particular, a TFT using a polysilicon film has a higher electric field effect mobility (also referred to as mobility) than a TFT using a conventional amorous silicon film, and high speed operation is therefore possible. As a result, it becomes possible to perform pixel control, conventionally performed by a driver circuit external to the substrate, by a driver circuit formed on the same substrate as the pixel.

This type of active matrix display device has been in the spotlight because of the many advantage which can be obtained by incorporating various circuits and elements on the same substrate in this type of active matrix display device, such as reduced manufacturing cost, small size, increased yield, and higher throughput.

Switching elements are formed by a TFT for each of the pixels in the active matrix display device, current control is performed by driver elements using the switching elements, and an EL layer (electroluminescence layer) is made to emit light. A typical pixel structure at this time is disclosed in, for example, U.S. Pat. No. 5,684,365 (Japanese Patent Application Laid-open No. 8-234683) and Japanese Patent Application Laid-open No. Hei 10-189252.

In performing color display of these EL display devices, trials for disposing EL layers that emit three primary colors of red (R), green (G) and blue (B) on respective pixels have been made. However, most of the materials used in general as EL layers are organic materials and the patterning is extremely difficult. This is because EL materials themselves are very weak to moisture, and it is difficult to treat them as they easily dissolve even in a developing solution.

As a technology for solving such a problem, a technique of forming EL layers by ink jet method is suggested. For example, an active matrix EL display in which EL layers are formed ink jet method is disclosed in Japanese Patent Application Laid-Open No. Hei 10-012377. Further, similar technique is also disclosed in Shimada, T. et al., SID 99 DIGEST, P376-9, "Multicolor Pixel Patterning of Light-Emitting Polymers by Ink-jet Printing."

However, because ink jet method is performed under normal pressure, it is disadvantageous in the point that contaminants in the external atmosphere are easily taken. Namely, it has a problem that because EL layers are formed in a state of easily including mobile ions such as alkaline metals, diffusion of the alkaline metals therefore can give fatal damage to the TFTs. Note that throughout the Specification alkaline metals and alkali-earth metals are together referred to as "alkaline metals".

SUMMARY OF THE INVENTION

The present invention is made in view of the above problems, and an object of the present invention is to provide a method for manufacturing an electro-optical device having good operation performance and high reliability, and in particular, to provide a method for manufacturing an EL display device. Another object of the present invention is to increase the quality of electronic equipment (an electronic device) having the electro-optical device as a display by increasing the image quality of the electro-optical device.

In order to achieve the above objects, diffusion of alkaline metals from the EL elements that are formed by ink jet method is prevented by an insulating film (passivation film) disposed between the EL elements and TFTs in the present invention. In concrete, an insulating film that is capable of preventing penetration of alkaline metals is disposed over a leveling film that covers TFTs. Namely one with sufficiently small alkaline metal diffusion speed at an operation temperature of the EL display device (typically from 0 to 100° C.) may be used as the insulating film.

More preferably, an insulating film that do not penetrate moisture and alkaline metals and that has high pyroconductivity (high radiating effect), and dispose the insulating film in contact with the EL elements or more preferably surround the EL elements by such insulating film. In other words, an insulating film that is effective for blocking the moisture and alkaline metals and that has radiation effect is disposed to the nearest position possible to the EL elements, and prevent degradation of the EL elements by the insulating film.

Further, in case that such insulating film cannot be used as a single layer, a laminate of an insulating film having blocking effect against moisture and alkaline metals and an insulating film having radiating effect can be used.

In anyways, measures to protect the TFTs that drive the EL elements thoroughly from alkaline metals are required in case of forming an EL layer by ink jet method, and further in order to prevent degradation of EL layer itself (it can also be referred to as degradation of EL element), measures against both moisture and heat should be considered at the same time.

DETAILED DESCRIPTION OF THE PREFERRED EMBODIMENTS

Embodiment Mode

Figure 1:
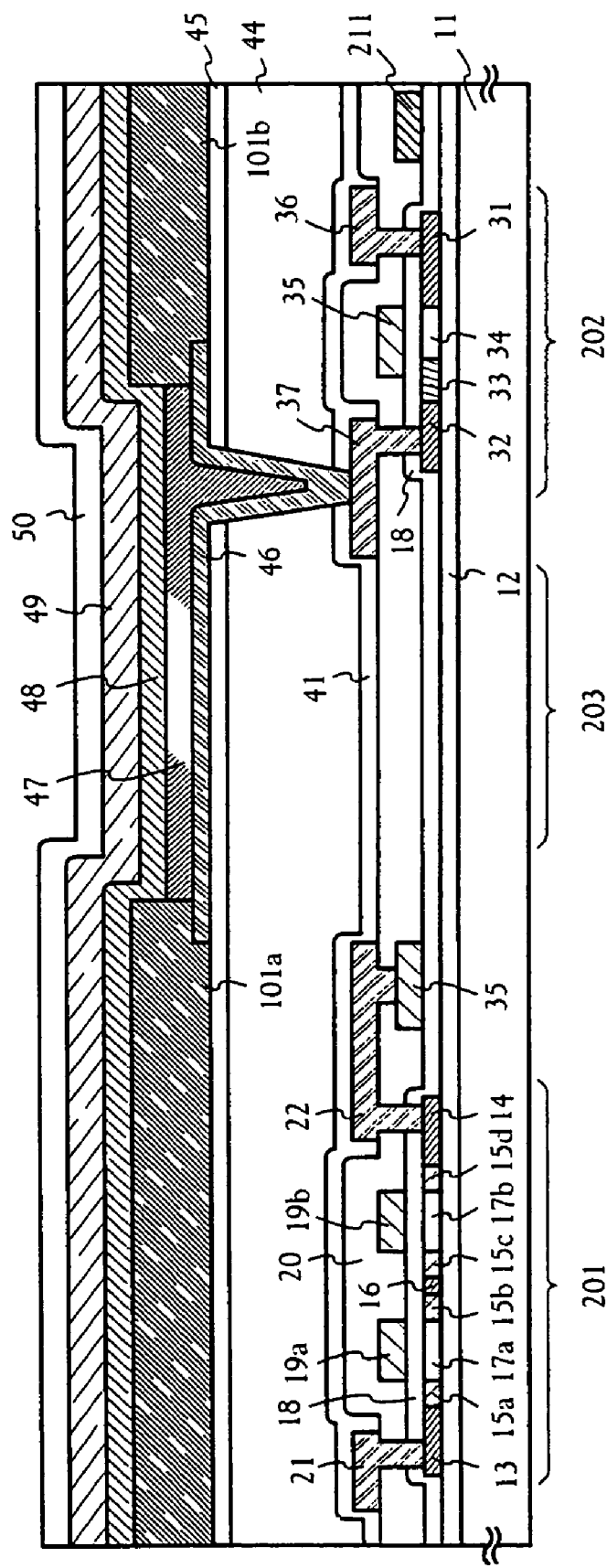
FIG. 1 is a diagram showing the cross sectional structure of the pixel portion of an EL display device of the present invention.
Figure 2A:
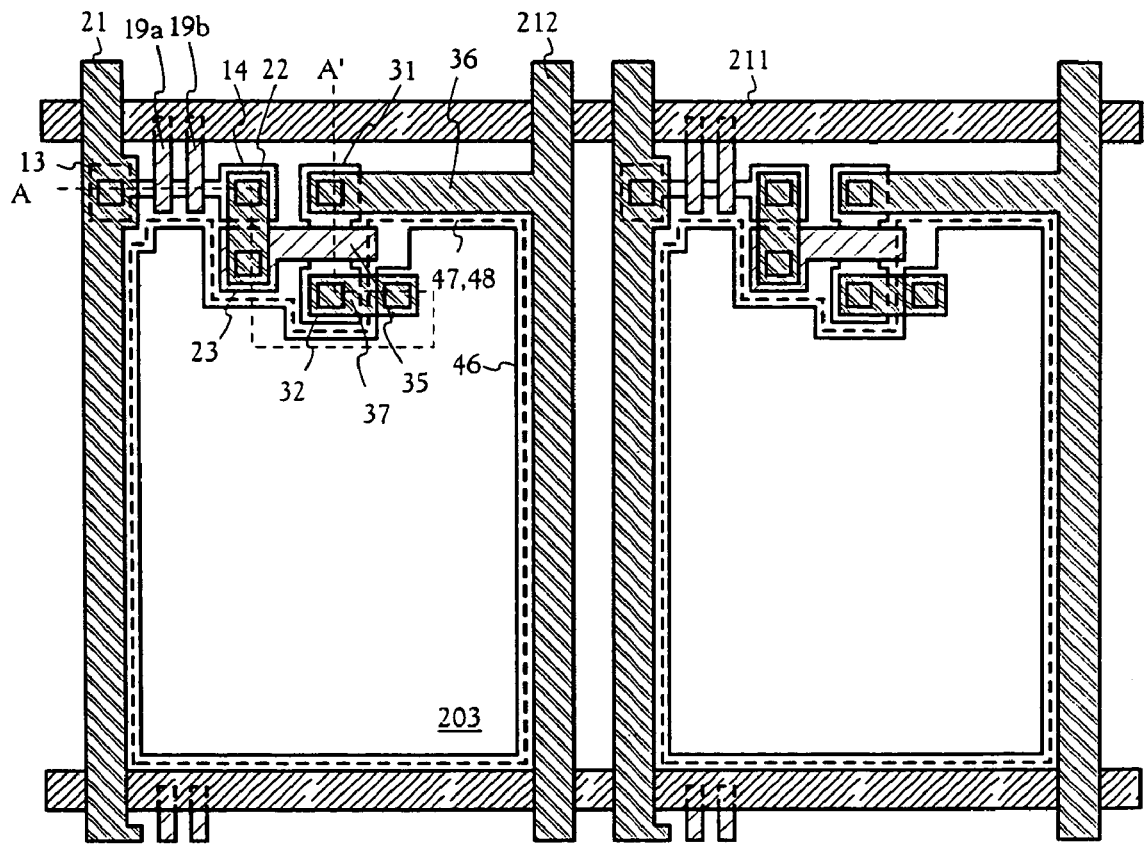
FIGS. 2A and 2B are diagrams showing the top view and the composition, respectively, of the pixel portion of an EL display device of the present invention.
Figure 2B:
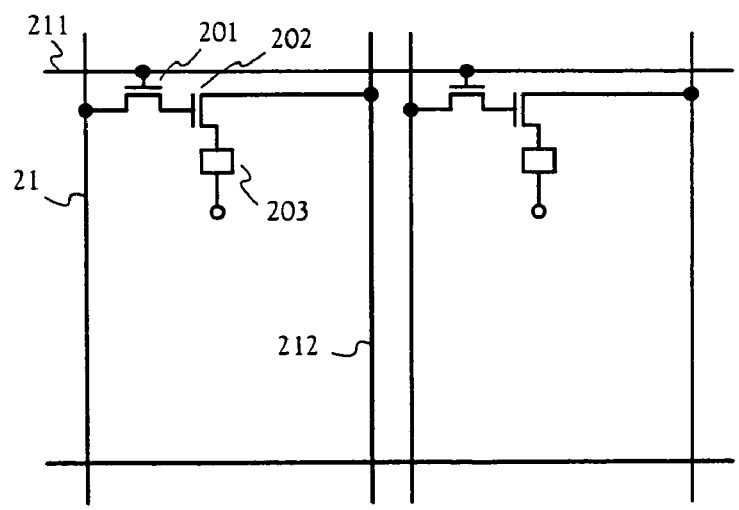

FIGS. 1 to 2B are used in explaining the preferred embodiment modes of the present invention. Shown in FIG. 1 is a cross sectional diagram of a pixel of an EL display device of the present invention, in FIG. 2A is its top view, and in FIG. 2B is a circuit composition. In practice, a pixel portion (image display portion) is formed with a multiple number of this type of pixel arranged in a matrix state.

Note that the cross sectional diagram of FIG. 1 shows a cross section cut along the line A-A' in the top view shown in FIG. 2A. Common symbols are used in FIG. 1 and in FIGS. 2A and 2B, and therefore the three figures may be referenced as appropriate. Furthermore, two pixels are shown in the top view of FIG. 2A, and both have the same structure.

Reference numeral 11 denotes a substrate, and reference numeral 12 denotes an insulating film that becomes a base film (hereinafter referred to as base film). A glass substrate, a glass ceramic substrate, a quartz substrate, a silicon substrate, a ceramic substrate, a metallic substrate, or a plastic substrate (including a plastic film) can be used as the substrate 11.

Further, the base film 12 is especially effective for cases in which a substrate containing mobile ions, or a substrate having conductivity, is used, but need not be formed for a quartz substrate. An insulating film containing silicon may be formed as the base film 12. Note that the term "insulating film containing silicon" indicates, specifically, an insulating film that contains silicon, oxygen, and nitrogen in predetermined ratios such as a silicon oxide film, a silicon nitride film, or a silicon nitride oxide film (denoted by $SiO_xN_y$).

Further, it is effective to release the generated heat by TFTs by giving radiation effect to the base film 12 in preventing degradation of TFTs and degradation of EL elements. All of the known materials can be used for giving radiating effect.

Two TFTs are formed within the pixel here. Reference numeral 201 denotes a TFT functioning as a switching element (hereafter referred to as a switching TFT), and reference numeral 202 denotes a TFT functioning as a current control element for controlling the amount of current flowing to an EL element (hereafter referred to as a current control TFT), and both are formed by an n-channel TFT.

The field effect mobility of the n-channel TFT is larger than the field effect mobility of a p-channel TFT, and therefore the operation speed is fast and large electric current can flow easily. Further, even with the same amount of current flow, the n-channel TFT can be made smaller. The effective surface area of the display portion therefore becomes larger when using the n-channel TFT as a current control TFT, and this is preferable.

The p-channel TFT has the advantages that hot carrier injection essentially does not become a problem, and that the off current value is low, and there are already reports of examples of using the p-channel TFT as a switching TFT and as a current control TFT. However, by using a structure in which the position of an LDD region differs, the problems of hot carrier injection and the off current value in the n-channel TFT are solved by the present invention. The present invention is characterized by the use of n-channel TFTs for all of the TFTs within all of the pixels.

Note that it is not necessary to limit the switching TFT and the current control TFT to n-channel TFTs in the present invention, and that it is possible to use p-channel TFTs for either the switching TFT, the current control TFT, or both.

The switching TFT 201 is formed having: an active layer comprising a source region 13, a drain region 14, LDD regions 15a to 15d, a high concentration impurity region 16, and channel forming regions 17a and 17b; a gate insulating film 18; gate electrodes 19a and 19b, a first interlayer insulating film 20, a source wiring 21, and a drain wiring 22.

As shown in FIG. 2A, the present invention is characterized in that the gate electrodes 19a and 19b become a double gate structure electrically connected by a gate wiring 211 which is formed by a different material (a material having a lower resistance than the gate electrodes 19a and 19b). Of course, not only a double gate structure, but a so-called multi-gate structure (a structure containing an active layer having two or more channel forming regions connected in series), such as a triple gate structure, may also be used. The multi-gate structure is extremely effective in lowering the value of the off current, and by making the switching TFT 201 of the pixel into a multi-gate structure with the present invention, a low off current value can be realized for the switching TFT.

The active layer is formed by a semiconductor film containing a crystal structure. In other words, a single crystal semiconductor film may be used, and a polycrystalline semiconductor film or a microcrystalline semiconductor film may also be used. Further, the gate insulating film 18 may be formed by an insulating film containing silicon. Additionally, any conducting film can be used for the gate electrodes, the source wiring, and the drain wiring.

In addition, the LDD regions 15a to 15d in the switching TFT 201 are formed so as not to overlay with the gate electrodes 19*a* and 19*b* by interposing the gate insulating film 18. This structure is extremely effective in reducing the of f current value.

Note that the formation of an offset region (a region that comprises a semiconductor layer having the same composition as the channel forming regions, and to which a gate voltage is not applied) between the channel forming regions and the LDD regions is more preferable for reducing the of f current value. Further, when a multi-gate structure having two or more gate electrodes is used, the high concentration impurity region formed between the channel forming regions is effective in lowering the value of the off current.

By thus using the multi-gate structure TFT as the switching TFT 201, as above, a switching element having a sufficiently low off current value is realized by the present invention. The gate voltage of the current control element can therefore be maintained for a sufficient amount of time (for a period from one selection until the next selection) without disposing a capacitor such as one shown in FIG. 2 of Japanese Patent Application Laid-Open No. Hei 10-189252.

Namely, it becomes possible to eliminate the capacitor which causes a reduction in the effective luminescence surface area, and it becomes possible to increase the effective luminescence surface area. This means that the image quality of the EL display device can be made brighter.

Next, the current control TFT 202 is formed having: an active layer comprising a source region 31, a drain region 32, an LDD region 33, and a channel forming region 34; a gate insulating film 18; a gate electrode 35; the first interlayer insulating film 20; a source wiring 36; and a drain wiring 37. Note that the gate electrode 35 has a single gate structure, but a multi-gate structure may also be used.

As shown in FIGS. 2A and 2B, the drain of the switching TFT is electrically connected to the gate of the current control TFT. Specifically, the gate electrode 35 of the current control TFT 202 is electrically connected to the drain region 14 of the switching TFT 201 through the drain wiring (also referred to as a connection wiring) 22. Further, the source wiring 36 is connected to an electric current supply wiring 212.

Figure 8:
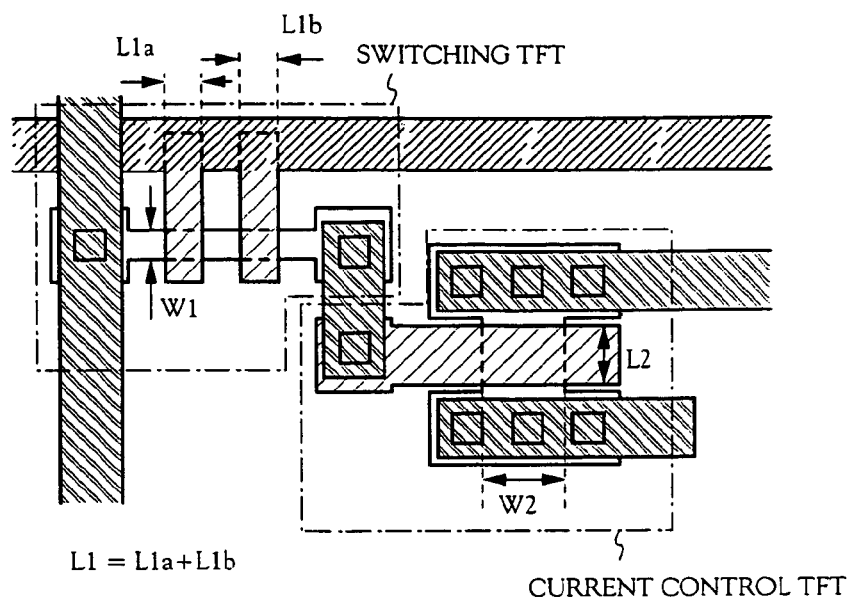
FIG. 8 is an enlarged diagram of the pixel portion of an EL display device of the present invention.

A characteristic of the current control TFT 202 is that its channel width is larger than the channel width of the switching TFT 201. Namely, as shown in FIG. 8, when the channel length of the switching TFT is taken as L1 and its channel width as W1, and the channel length of the current control TFT is taken as L2 and its channel width as W2, a relational expression is reached in which $W2/L2 \geq 5 \times W1/L1$ (preferably $W2/L2 \leq 10 \times W1/L1$). Consequently, it is possible for more current to easily flow in the current control TFT than in the switching TFT.

Note that the channel length L1 of the multi-gate structure switching TFT is the sum of each of the channel lengths of the two or more channel forming regions formed. A double gate structure is formed in the case of FIG. 8, and therefore the sum of the channel lengths L1*a* and L1*b*, respectively, of the two channel-forming regions becomes the channel length L1 of the switching TFT. That is, L1=L1*a*+L1*b*.

The channel lengths L1 and L2, and the channel widths W1 and W2 are not specifically limited to a range of values with the present invention, but it is preferable that W1 be from 0.1 to 5 µm (typically between 1 and 3 µm), and that W2 be from 0.5 to 30 µm (typically between 2 and 10 µm). It is preferable that L1 be from 0.2 to 18 µm (typically between 2 and 15 µm), and that L2 be from 0.1 to 50 µm (typically between 1 and 20 µm) at this time.

Note that it is preferable to set the channel length L in the current control TFT on the long side in order to prevent excessive current flow. Preferably, $W2/L2 \geq 3$ (more preferably $W2/L2 \geq 5$). It is also preferable that the current flow per pixel is from 0.5 to 2 µA (better between 1 and 1.5 µA).

By setting the numerical values within this range, all standards, from an EL display device having a VGA class number of pixels (640×480) to an EL display device having a high vision class number of pixels (1920×1080) can be included.

Furthermore, the length (width) of the LDD region formed in the switching TFT 201 is set from 0.5 to 3.5 µm, typically between 2.0 and 2.5 µm.

The EL display device shown in FIG. 1 is characterized in that the LDD region 33 is formed between the drain region 32 and the channel forming region 34 in the current control TFT 202. In addition, the LDD region 33 has both a region which overlaps, and a region which does not overlap the gate electrode 35 by interposing a gate insulating film 18.

The current control TFT 202 supplies a current for making the EL element 203 luminesce, and at the same time controls the amount supplied and makes gray scale display possible. It is therefore necessary that there is no deterioration when the current flows, and that steps are taken against deterioration due to hot carrier injection. Furthermore, when black is displayed, the current control TFT 202 is set in the off state, but if the off current value is high, then a clean black color display becomes impossible, and this invites problems such as a reduction in contrast. It is therefore necessary to suppress the value of the off current.

Regarding deterioration due to hot carrier injection, it is known that a structure in which the LDD region overlaps the gate electrode is extremely effective. However, if the entire LDD region is made to overlap the gate electrode, then the value of the off current rises, and therefore the applicant of the present invention resolves both the hot carrier and off current value countermeasures at the same time by a novel structure in which an LDD region which does not overlap the gate electrode is formed in series.

The length of the LDD region which overlaps the gate electrode may be made from 0.1 to 3 µm (preferable between 0.3 and 1.5 µm) at this point. If it is too long, then the parasitic capacitance will become larger, and if it is too short, then the effect of preventing hot carrier will become weakened. Further, the length of the LDD region not overlapping the gate electrode may be set from 1.0 to 3.5 µm (preferable between 1.5 and 2.0 µm). If it is too long, then a sufficient current becomes unable to flow, and if it is too short, then the effect of reducing off current value becomes weakened.

A parasitic capacitance is formed in the above structure in the region where the gate electrode and the LDD region overlap, and therefore it is preferable that this region not be formed between the source region 31 and the channel forming region 34. The carrier (electrons in this case) flow direction is always the same for the current control TFT, and therefore it is sufficient to form the LDD region on only the drain region side.

Further, looking from the viewpoint of increasing the amount of current that is able to flow, it is effective to make the film thickness of the active layer (especially the channel forming region) of the current control TFT 202 thick (preferably from 50 to 100 nm, more preferably between 60 and 80 nm). Conversely, looking from the point of view of making the off current value smaller for the switching TFT 201, it is effective to make the film thickness of the active layer (especially the channel forming region) thin (preferably from 20 to 50 nm, more preferably between 25 and 40 nm).

Next, reference numeral 41 denotes a first passivation film, and its film thickness may be set from 10 nm to 1 µm (preferably between 200 and 500 nm). An insulating film containing silicon (in particular, preferably a silicon nitride oxide film or a silicon nitride film) can be used as the passivation film material. The passivation film 41 plays the role of protecting the manufactured TFT from contaminant matter and moisture. Alkaline metals such as sodium are contained in an EL layer formed on the final TFT. In other words, the first passivation film 41 works as a protecting layer so that these alkaline metals (mobile ions) do not penetrate into the TFT. Note that alkaline metals and alkaline-earth metals are contained in the term 'alkaline metal' throughout this specification.

Further, by making the passivation film 41 possess a heat radiation effect, it is also effective in preventing thermal degradation of the EL layer. Note that light is emitted from the base 11 side in the FIG. 1 structure of the EL display device, and therefore it is necessary for the passivation film 41 to have light transmitting characteristics. In addition, in case of using an organic material for the EL layer, it deteriorates by bonding with oxygen so it if preferable not to use an insulating film that easily releases oxygen.

An insulating film containing at least one element selected from the group consisting of B (boron), C (carbon), and N (nitrogen), and at least one element selected from the group consisting of Al (aluminum), Si (silicon), and P (phosphorous) can be given as a light transparent material that prevents penetration of alkali metals and also possess heat radiation qualities. For example, it is possible to use: an aluminum nitride compound, typically aluminum nitride ($Al_xN_y$); a silicon carbide compound, typically silicon carbide ($Si_xC_y$); a silicon nitride compound, typically silicon nitride ($Si_xN_y$); a boron nitride compound, typically boron nitride ($B_xN_y$); or a boron phosphate compound, typically boron phosphate ($B_xP_y$). Further, an aluminum oxide compound, typically aluminum oxide ($Al_xO_y$), has superior light transparency characteristics, and has a thermal conductivity of 20 $Wm^{-1} K^{-1}$, and can be said to be a preferable material. These materials not only possess heat radiation qualities, but also are effective in preventing the penetration of substances such as moisture and alkaline metals. Note that x and y are arbitrary integers for the above transparent materials.

The above chemical compounds can also be combined with another element. For example, it is possible to use nitrated aluminum oxide, denoted by $AlN_xO_y$, in which nitrogen is added to aluminum oxide. This material also not only possesses heat radiation qualities, but also is effective in preventing the penetration of substances such as moisture and alkaline metals. Note that x and y are arbitrary integers for the above nitrated aluminum oxide.

Furthermore, the materials recorded in Japanese Patent Application Laid-open No. Sho 62-90260 can also be used. Namely, a chemical compound containing Si, Al, N, O, and M can also be used (note that M is a rare-earth element, preferably an element selected from the group consisting of Ce (cesium), Yb (ytterbium), Sm (samarium), Er (erbium), Y (yttrium), La (lanthanum), Gd (gadolinium), Dy (dysprosium), and Nd (neodymium)). These materials not only possess heat radiation qualities, but also are effective in preventing the penetration of substances such as moisture and alkaline metals.

Furthermore, carbon films such as a diamond thin film or amorphous carbons (especially those which have characteristics close to those of diamond; referred to as diamond-like carbon) can also be used. These have very high thermal conductivities, and are extremely effective as radiation layers. Note that if the film thickness becomes larger, there is brown banding and the transmissivity is reduced, and therefore it is preferable to use as thin a film thickness (preferably between 5 and 100 nm) as possible.

Note that the aim of the first passivation film 41 is in protecting the TFT from alkaline metals and from moisture, and therefore it must made so as to not lose this effect. A thin film made from a material possessing the above radiation effect can be used by itself, but it is effective to laminate this thin film and an insulating film that is capable of preventing penetration of alkaline metals and moisture (typically a silicon nitride film ($Si_xN_y$) or a silicon nitride oxide film ($SiO_xN_y$)). Note that x and y are arbitrary integers for the above silicon nitride films and silicon nitride oxide films.

Note that EL display devices are roughly divided into four types of color displays: a method of forming three types of EL elements corresponding to R, G, and B; a method of combining white color luminescing EL elements with color filters; a method of combining blue or blue-green luminescing EL elements and fluorescent matter (fluorescing color change layer, CCM); and a method of using a transparent electrode as a cathode (opposing electrode) and overlapping EL elements corresponding to R, G, and B.

The structure of FIG. 1 is an example of a case of using a method in which 3 kinds of EL layers are formed corresponding to R, G and B. Note that though one pixel is shown in FIG. 1, pixels of the same structure are formed in correspondence to the each color of red, green or blue, and accordingly color display can be performed. Known materials may be adopted for the EL layers of the respective colors.

Note that it is possible to implement the present invention without being concerned with the method of luminescence, and that all four of the above methods can be used with the present invention.

Further, after forming the first passivation film 41, a second interlayer insulating film (it may also be referred to as a flattening film) 44 is formed to cover each TFT, and leveling of step due to TFTs is performed. A resin film is preferable for the second interlayer insulating film 44 and it is good if polyimide, polyamide, acrylic, BCB (benzocyclobutene), etc., is used. Needless to say, an inorganic film may be used if a sufficient leveling is possible.

The leveling of steps due to the TFT by the second interlayer insulating film 44 is extremely important. The EL layer formed afterward is very thin, and therefore there are cases in which poor luminescence is caused by the existence of a step. It is therefore preferable to perform leveling before forming a pixel electrode so as to be able to form the EL layer on as level a surface as possible.

Further, reference numeral 45 is a second passivation film, and plays an important role of blocking alkaline metals diffused from the EL elements. A film thickness maybe from 5 nm to 1 μm (typically between 20 and 300 nm). An insulating film capable of preventing penetration of alkaline metals is used as the second passivation film 45. Materials used for the first passivation film 41 can be used as the material.

Furthermore, this second passivation film 45 functions as a radiating layer that function to release heat generated on EL elements so as not to store heat on the El elements. In addition, in case that the second interlayer insulating film 44 is a resin film it is weak against heat, so the measures are taken that the heat generated by EL elements not give bad influence on the second interlayer insulating film 44.

It is effective to perform leveling of the TFT by the resin film in manufacturing the EL display device, as stated above, but there has not been a conventional structure which considers the deterioration of the resin film due to heat generated by the EL element. It can be said that one of the characteristics of the present invention is to solve that point by disposing the second passivation film 45.

Further, the second passivation film 45 prevents the above stated degradation due to heat, and at the same time it can also function as a protecting layer in order that alkaline metals within the EL layer do not diffuse toward the TFT, and in addition it also functions as a protecting layer so that moisture and oxygen do not penetrate into the EL layer from the TFT.

The point that TFT side and EL element side are segregated by an insulating film that has high radiating effect and that is capable of preventing penetration of moisture and alkaline metals, is one of the important characteristics of the present invention and it can be said that it is a structure which does not exist in a conventional EL display device.

Reference numeral 46 denotes a pixel electrode (EL element anode) made from a transparent conducting film and it is formed so as to be connected to the drain wiring 37 of the current control TFT 202 in an opening section after opening a contact hole in the second passivation film 45, in second interlayer insulating film 44 and in the first passivation film 41.

After the pixel electrode 46 is formed, banks 101*a* and 101*b* comprising a resin film are formed on the second passivation film 45. A photo sensitive polyimide film is formed by spin coating in the present embodiment mode and banks 101*a* and 101*b* are formed by patterning. These banks 101*a* and 101*b* are grooves in forming EL layers by ink jet method, and the position where EL elements are formed are determined by the disposition of these banks.

After banks 101*a* and 101*b* are formed, an EL layer 47 is next formed (an organic material is preferable). The EL layer may be used by a single layer by a laminate structure, but there are more cases in which laminate structure is used. Though various laminate structures are suggested by combining an emitting layer, an electron transporting layer, an electron injecting layer, a hole injecting layer or a hole transporting layer, any structure is acceptable in the present invention. Further, a fluorescent dye, etc. may be doped in the EL layer.

All already known EL materials can be used by the present invention. Organic materials are widely known as such materials, and considering the driver voltage, it is preferable to use an organic material. For example, the materials disclosed in the following U.S. Patents and Japanese patent applications can be used as the organic EL material:

U.S. Pat. No. 4,356,429; U.S. Pat. No. 4,539,507; U.S. Pat. No. 4,720,432; U.S. Pat. No. 4,769,292; U.S. Pat. No. 4,885,211; U.S. Pat. No. 4,950,950; U.S. Pat. No. 5,059,861; U.S. Pat. No. 5,047,687; U.S. Pat. No. 5,073,446; U.S. Pat. No. 5,059,862; U.S. Pat. No. 5,061,617; U.S. Pat. No. 5,151,629; U.S. Pat. No. 5,294,869; U.S. Pat. No. 5,294,870; Japanese Patent Application Laid-open No. Hei 10-189525; Japanese Patent Application Laid-open No. Hei 8-241048; and Japanese Patent Application Laid-open No. Hei 8-78159, the disclosures of which are herein incorporated by reference.

Specifically, an organic material such as the one shown by the following general formula can be used as a hole injecting layer.

[Chem 1]
Here, Q is either N or a C—R (carbon chain); M is a metal, a metal oxide, or a metal halide; R is hydrogen, an alkyl, an aralkyl, an aryl, or an alkalyl; and T1 and T2 are unsaturated six member rings including substituent such as hydrogen, alkyl, or halogen.

Furthermore, an aromatic tertiary amine can be used as an organic material hole transporting layer, preferably including the tetraaryldiamine shown by the following general formula.

[Chem 2]
In Chem 2 Are is an arylene group, n is an integer from 1 to 4, and Ar, $R_7$, $R_8$, and $R_9$ are each various chosen aryl groups.

In addition, a metal oxynoid compound can be used as an organic material EL layer, electron transporting layer, or electron injecting layer. A material such as that shown by the general formula below may be used as the metal oxinoid compound.

[Chem 3]
It is possible to substitute $R_2$ through $R_7$, and a metal oxinoid such as the following can also be used.

[Chem 4]
In Chem 4, $R_2$ through $R_7$ are defined as stated above; $L_1$ through $L_5$ are carbohydrate groups containing from 1 to 12 carbon elements; and both $L_1$ and $L_2$, or both $L_2$ and $L_3$ are formed by benzo-rings. Further, a metal oxinoid such as the following may also be used.

[Chem 5]
It is possible to substitute $R_2$ through $R_6$ here. Coordination compounds having organic ligands are thus included as organic EL materials. Note that the above examples are only some examples of organic EL materials which can be used as the EL material of the present invention, and that there is absolutely no need to limit the EL material to these.

In the present invention, since an ink-jet method is used as a forming method of an EL layer, many polymer materials can be used as preferable EL materials. As typical polymer materials, polymer materials, such as polyparaphenylene vinylene (PPV), polyfluorene, or polyvinylcarbazole (PVK), can be enumerated. For colorization, it is preferable to use, for example, cyanopolyphenylene vinylene as a red light emitting material, to use polyphenylene vinylene as a green light emitting material, and to use polyphenylene vinylene and polyalkylphenylene as a blue light emitting material.

Incidentally, there are various types as PPV organic EL materials, and a molecular formula as set forth below is reported for example (H. Shenk, H. Becker, O. Gelsen, E. Kluge, E. Kreuder, and H. Spreitzer, Euro Display, Proceedings, 1999, p. 33-37, "Polymers for Light Emitting Diodes").

[Chem 6]

[Chem 7]
It is also possible to use polyphenylvinyl having a molecular formula disclosed in Japanese Patent Application Laid-open No. Hei 10-92576. The molecular formula is as follows:

[Chem 8]

[Chem 9]
As a PVK organic EL material, there is a molecular formula as follows:

[Chem 10]
A polymer organic EL material may be applied after it is dissolved in a solvent while it is in a polymer state, or it may be polymerized after it is dissolved in a solvent while it is in a monomer state and application thereof is made. In the case where application is made-in a monomer state, a polymer precursor is first formed, and is polymerized by heating in vacuum so that it becomes a polymer.

As a specific light emitting layer, it is appropriate that cyanopolyphenylene vinylene is used for a light emitting layer radiating red light, polyphenylene vinylene is used for a light emitting layer radiating green light, and polyphenylene vinylene or polyalkylphenylene is used for a light emitting layer radiating blue light. It is appropriate that its film thickness is made 30 to 150 nm (preferably 40 to 100 nm).

As a typical solvent, toluene, xylene, cymene, chloroform, dichloromethane, γ-butyl lactone, butyl cellosolve, and NMP (N-methyl-2-pyrolidone) are enumerated. It is also effective to add an additive to raise viscosity of an applied solution.

However, the foregoing examples are merely examples of organic EL materials, which can be used for EL materials of the present invention, and it is absolutely unnecessary to limit the invention to these. With respect to organic EL materials, which can be used for an ink-jet method, all materials disclosed in Japanese Patent Application Laid-open No. Hei 10-012377 can be cited.

Incidentally, although the ink-jet method is roughly classified into a bubble-jet method (also called a thermal ink-jet method) and a piezo method, in order to carry out the present invention, the piezo method is preferable. The difference between the two will be described with reference to FIGS. 19A and 19B.

Figure 19A:
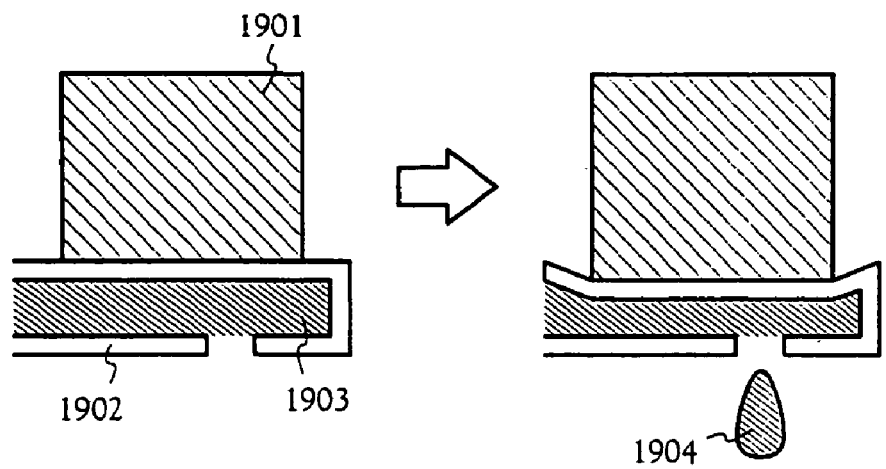
FIGS. 19A and 19B are diagrams for explaining ink jet method of the present invention.

FIG. 19A shows an example of the piezo method, and reference numeral 1901 designates a piezo element (piezoelectric element); 1902, a metal pipe; and 1903, a mixture solution of an ink material and an EL material (herein after referred to as an EL forming solution). When a voltage is applied, the piezo element is deformed, and the metal pipe 1902 is also deformed. As a result, the inside EL forming solution 1903 is ejected as a droplet 1904. Like this, by controlling the voltage applied to the piezo element, application of the EL forming solution is carried out. In this case, since the EL forming solution 1903 is pushed out by a physical external pressure, its composition etc. is not influenced at all.

Figure 19B:
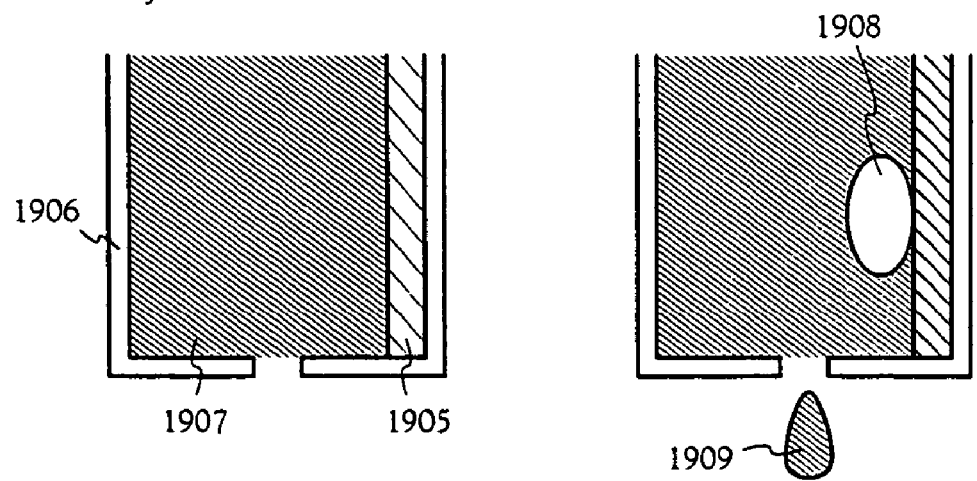

FIG. 19B shows an example of the bubble-jet method, and reference numeral 1905 designates a heating element; 1906, a metal pipe; and 1907, an EL forming solution. When an electric current is made to flow, the heating element 1905 generates heat, and a bubble 1908 is produced in the EL forming solution 1907. As a result, the EL forming solution 1907 is pushed out by the bubble, and is ejected as a droplet 1909. Like this, by controlling the electric current to the heating element, application of the EL forming solution is carried out. In this case, since the EL forming solution 1907 is heated by the heating element, there is a possibility that a bad influence is exerted according to the composition of the EL material.

Figure 20:
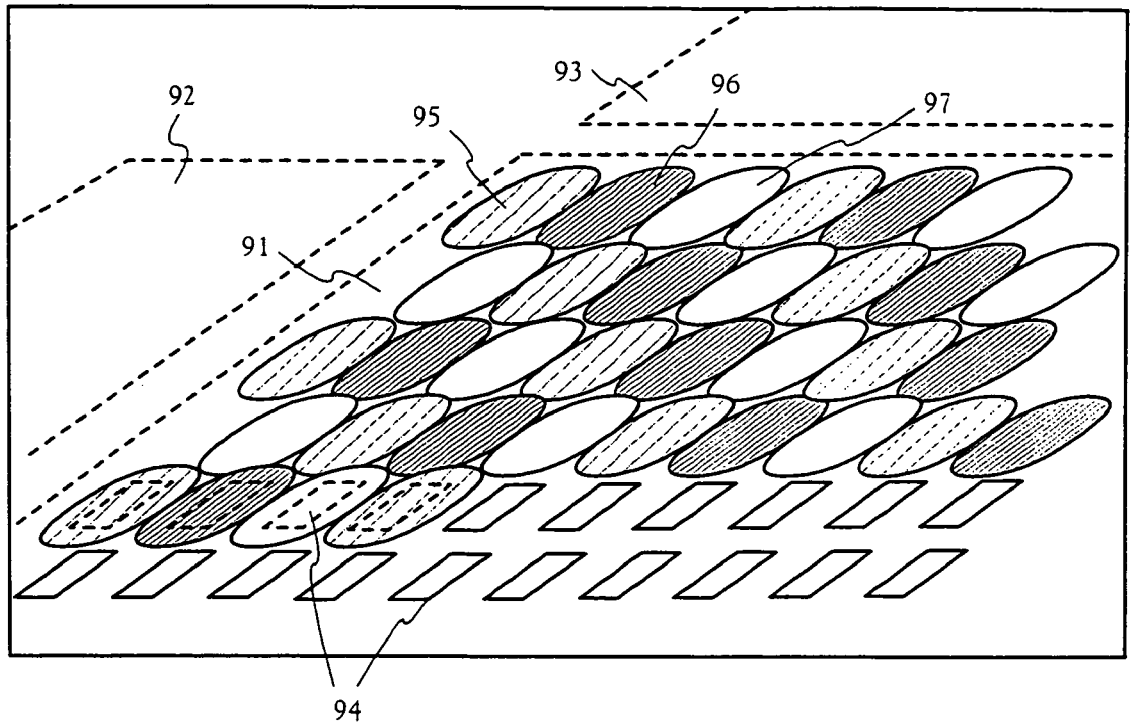
FIG. 20 is a diagram showing EL layer formation by ink jet method of the present invention.

When the EL material is applied and is formed on a device by actually using the ink-jet method, an EL layer is formed in the form as shown in FIG. 20. In FIG. 20, reference numeral 91 designates a pixel portion; and 92 and 93, driving circuits. A plurality of pixel electrodes 94 are formed in the pixel portion 91. Although not shown, each of the pixel electrodes is connected to a current controlling TFT. Actually, although a bank (see FIG. 1) for separating the pixel electrodes 94 respectively is provided, it is not shown here.

By the ink-jet method, a red light emitting EL layer 95, a green light emitting EL layer 96, and a blue light emitting EL layer 97 are formed. At this time, after all the red light emitting EL layers 95 are first formed, the green light emitting EL layers 96 and the blue light emitting EL layers 97 may be sequentially formed. In order to remove the solvent contained in the EL forming solution, a baking (firing) treatment is required. This baking treatment may be carried out after all the EL layers are formed, or may be separately carried out at the point of time when the formation of the respective color EL layers is finished.

When forming the EL layer, a pixel (pixel corresponding to red) where the red light emitting EL layer 95 is formed, a pixel (pixel corresponding to green) where the green light emitting EL layer 96 is formed, and a pixel (pixel corresponding to blue) where the blue light emitting EL layer 97 is formed, are made to have such a state that the respective colors are always in contact with each other as shown in FIG. 20.

Such arrangement is what is called delta arrangement, and is effective in making excellent color display. Since the merit of the ink-jet method is in the point that the EL layers of the respective colors can be made dotted ones, it can be said that to use it for an EL display device having a pixel portion of delta arrangement is the best mode.

On forming an EL layer 47, it is preferable that a treatment atmosphere is made a dry atmosphere having the least possible water and the formation is carried out in an inert gas. Since the EL layer is easily deteriorated by the existence of water or oxygen, it is necessary to remove such a factor to the utmost when the layer is formed. For example, a dry nitrogen atmosphere, a dry argon atmosphere, or the like is preferable.

When the EL layer 47 is formed by the ink-jet method in the manner as described above, a cathode 48 and a protective electrode 49 are next formed. In the present specification, a light emitting element formed of a pixel electrode (anode), an EL layer, and a cathode is called an EL element.

As the cathode 48, a material having a low work function and containing magnesium (Mg), lithium (Li), cesium (Cs), barium (Ba), potassium (K), beryllium (Be), or calcium (Ca) is used. Preferably, an electrode made of MgAg (material of Mg and Al mixed at a ratio of Mg:Ag=10:1) may be used. In addition, a MgAgAl electrode, a LiAl electrode, and a LiFAl electrode can be enumerated. The protective electrode 49 is an electrode, which is provided to protect the cathode 48 from outside moisture or the like, and a material containing aluminum (Al) or silver (Ag) is used. This protective electrode 49 has also a heat radiation effect.

Incidentally, it is preferable that the EL layer 47 and the cathode 48 are continuously formed in a dry inert gas atmosphere without opening to the air. In the case where an organic material is used for the EL layer, since it is very weak to moisture, this way is adopted to avoid moisture adsorption at the time of exposing to the air. Further, it is more preferable to continuously form not only the EL layer 47 and the cathode 48 but also the protective electrode 49 thereon.

Reference numeral 50 designates a third passivation film, and it is appropriate that its film thickness is made 10 nm to 1 μm (preferably 200 to 500 nm). Although a main object of providing the third passivation film 50 is to protect the EL layer 47 from moisture, a heat radiation effect may also be provided, similarly to the second passivation film 45. Thus, as a forming material, a similar to that of the first passivation film 41 can be used.. However, in the case where an organic material is used for the EL layer 47, since there is a possibility that the layer is deteriorated through combination with oxygen, it is desirable not to use an insulating film, which is apt to give off oxygen.

Besides, as described above, since the EL layer is weak to heat, it is preferable to form a film at the lowest possible temperature (preferably in a temperature range of from room temperature to 120° C.). Thus, it can be said that plasma CVD, sputtering, vacuum evaporation, ion plating, or a solution application (spin coating) is a preferable film forming method.

Like this, although the deterioration of the EL element can be sufficiently suppressed by merely providing the second passivation film 45, preferably, the EL element is surrounded by two-layer insulating films formed to be put at both sides of the EL element, such as the second passivation film 45 and the third passivation film 50, so that intrusion of moisture and oxygen into the EL layer is prevented, diffusion of alkaline metal from the EL layer is prevented, and storage of heat into the EL layer is prevented. As a result, deterioration of the EL layer is further suppressed, and an EL display device having high reliability can be obtained.

The EL display device of the present invention includes a pixel portion made of a pixel having a structure as in FIG. 1, and TFTs having different structures according to functions are disposed in the pixel. By this, it is possible to form a switching TFT having a sufficiently low off current value and a current controlling TFT strong against hot carrier injection in the same pixel, and it is possible to obtain the EL display device having high reliability and enabling excellent picture display (having high operation performance).

Incidentally, in the pixel structure of FIG. 1, although a TFT having a multi-gate structure is used as the switching TFT, it is not necessary to limit a structure of arrangement of LDD regions or the like to the structure of FIG. 1.

The present invention made of the foregoing structure will be described in more detail with reference to embodiments described below.

Embodiment 1

The embodiments of the present invention are explained using FIGS. 3A to 5C. A method of manufacturing a pixel portion, and TFTs of a driver circuit portion formed in the periphery of the pixel portion, is explained here. Note that in order to simplify the explanation, a CMOS circuit is shown as a basic circuit for the driver circuits.

Figure 3A:
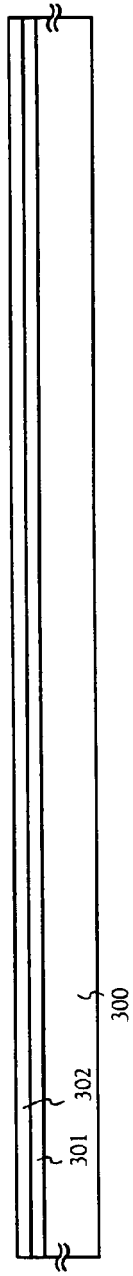
FIGS. 3A to 3E are diagrams showing manufacturing processes of an active matrix type EL display device of Embodiment 1.

First, as shown in FIG. 3A, a base film 301 is formed with a 300 nm thickness on a glass substrate 300. Silicon nitride oxide films are laminated as the base film 301 in embodiment 1. It is good to set the nitrogen concentration to between 10 and 25 wt % in the film contacting the glass substrate 300.

Further, it is effective to form an insulating film made from the same material as that of the first passivation film 41 shown in FIG. 1, as a portion of the base film 301. A large electric current flows in a current control TFT, heat is easily generated, and therefore it is effective to form an insulating film that has a heat radiating effect as close as possible to the current control TFT.

Next, an amorphous silicon film (not shown in the figures) is formed with a thickness of 50 nm on the base film 301 by a known deposition method. Note that it is not necessary to limit this to the amorphous silicon film, and another film may be formed provided that it is a semiconductor film containing an amorphous structure (including a microcrystalline semiconductor film). In addition, a compound semiconductor film containing an amorphous structure, such as an amorphous silicon germanium film, may also be used. Further, the film-thickness may be made from 20 to 100 nm.

The amorphous silicon film is then crystallized by a known method, forming a crystalline silicon film (also referred to as a polycrystalline silicon film or a polysilicon film) 302. Thermal crystallization using an electric furnace, laser annealing crystallization using a laser, and lamp annealing crystallization using an infrared lamp exist as known crystallization methods. Crystallization is performed in embodiment 1 using light from an excimer laser which uses XeCl gas.

Note that pulse emission type excimer laser light formed into a linear shape is used in embodiment 1, but a rectangular shape may also be used, and continuous emission argon laser light and continuous emission excimer laser light can also be used.

The crystalline silicon film is used as an active layer of the TFTs in embodiment 1, but it is also possible to use an amorphous silicon film as the active layer. However, it is necessary for a large current to flow through the current control TFT, and therefore it is more advantageous to use the crystalline silicon film, through which current easily flows.

Note that it is effective to form the active layer of the switching TFT, in which there is a necessity to reduce the off current, by the amorphous silicon film, and to form the active layer of the current control TFT by the crystalline silicon film. Electric current flows with difficulty in the amorphous silicon film because the carrier mobility is low, and the off current does not easily flow. In other words, the most can be made of the advantages of both the amorphous silicon film, through which current does not flow easily, and the crystalline silicon film, through which current easily flows.

Figure 3B:
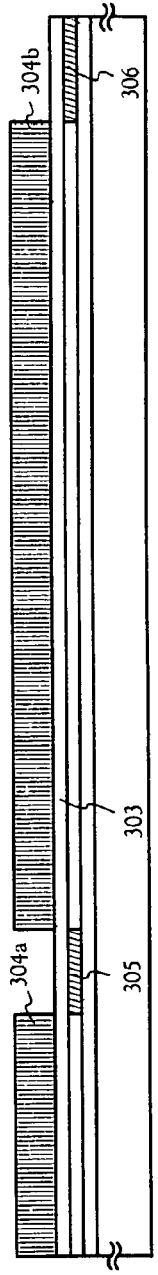

Next, as shown in FIG. 3B, a protecting film 303 is formed on the crystalline silicon film 302 from a silicon oxide film having a thickness of 130 nm. This thickness may be chosen within the range of 100 to 200 nm (preferably between 130 and 170 nm). Furthermore, other films may also be used providing that they are insulating films containing silicon. The protecting film 303 is formed so that the crystalline silicon film is not directly exposed to plasma during addition of an impurity, and so that it is possible to have delicate concentration control of the impurity.

Resist masks 304a and 304b are then formed on the protecting film 303, and an impurity element which imparts n-type conductivity (hereafter referred to as an n-type impurity element) is added. Note that elements residing in periodic table group 15 are generally used as the n-type impurity element, and typically phosphorous or arsenic can be used. Note that a plasma doping method is used, in which phosphine ($PH_3$) is plasma activated without separation of mass, and phosphorous is added at a concentration of $1\times10^{18}$ atoms/$cm^3$ in embodiment 1. An ion implantation method, in which separation of mass is performed, may also be used, of course.

The dose amount is regulated so that the n-type impurity element is contained in n-type impurity regions 305 and 306, thus formed by this process, at a concentration of $2\times10^{16}$ to $5\times10^{19}$ atoms/$cm^3$ (typically between $5\times10^{17}$ and $5\times10^{18}$ atoms/$cm^3$).

Figure 3C:
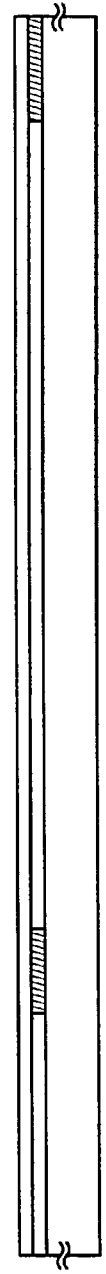

Next, as shown in FIG. 3C, the protecting film 303 is removed, and activation of the added periodic table group V element is performed. A known technique of activation may be used as the means of activation, and activation is done in embodiment 1 by irradiation of excimer laser light. Both of pulse emission type laser and a continuous emission type laser may be used, and it is not necessary to place any limits on the use of excimer laser light. The goal is the activation of the added impurity element, and it is preferable that irradiation is performed at an energy level at which the crystalline silicon film does not melt. Note that the laser irradiation may also be performed with the protecting film 303 in place.

Activation by heat treatment may also be performed along with activation of the impurity element by laser light. When activation is performed by heat treatment, considering the heat resistance of the substrate, it is good to perform heat treatment on the order of 450 to 550° C..

A boundary portion (connecting portion) with regions along the edges of the n-type impurity regions 305 and 306, namely regions along the perimeter into which the n-type impurity element, which exists in the n-type impurity regions 305 and 306, is not added, is defined by this process. This means that, at the point when the TFTs are later completed, extremely good connections can be formed between LDD regions and channel forming regions.

Figure 3D:
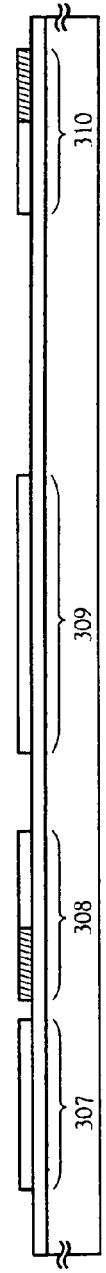

Unnecessary portions of the crystalline silicon film are removed next, as shown in FIG. 3D, and island shape semiconductor films (hereafter referred to as active layers) 307 to 310 are formed.

Figure 3E:
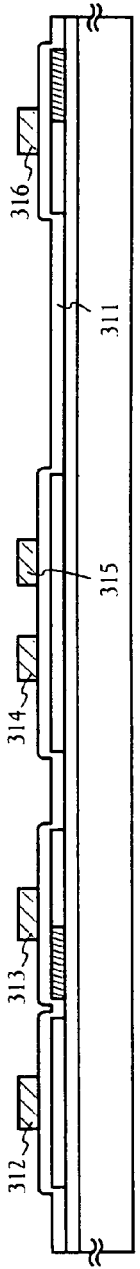

Then, as shown in FIG. 3E, a gate insulating film 311 is formed, covering the active layers 307 to 310. An insulating film containing silicon and with a thickness of 10 to 200 nm, preferably between 50 and 150 nm, may be used as the gate insulating film 311. A single layer structure or a lamination structure may be used. A 110 nm thick silicon nitride oxide film is used in embodiment 1.

A conducting film with a thickness of 200 to 400 nm is formed next and patterned, forming gate electrodes 312 to 316. Note that in embodiment 1, the gate electrodes and lead wirings electrically connected to the gate electrodes (hereafter referred to as gate wirings) are formed from different materials. Specifically, a material having a lower resistance than that of the gate electrodes is used for the gate wirings. This is because a material which is capable of being microprocessed is used as the gate electrodes, and even if the gate wirings cannot be micro-processed, the material used for the wirings has low resistance. Of course, the gate electrodes and the gate wirings may also be formed from the same material.

Further, the gate wirings may be formed by a single layer conducting film, and when necessary, it is preferable to use a two layer or a three layer lamination film. All known conducting films can be used as the gate electrode material. However, as stated above, it is preferable to use a material which is capable of being micro-processed, specifically, a material which is capable of being patterned to a line width of 2 μm or less.

Typically, a film of a material chosen from among the group consisting of tantalum (Ta), titanium (Ti), molybdenum (Mo), tungsten (W), and chromium (Cr); or a nitrated compound of the above elements (typically a tantalum nitride film, a tungsten nitride film, or a titanium nitride film); or an alloy film of a combination of the above elements (typically a Mo—W alloy or a Mo—Ta alloy); or a silicide film of the above elements (typically a tungsten silicide film or a titanium silicide film); or a silicon film which has been made to possess conductivity can be used. A single layer film or a lamination may be used, of course.

A lamination film made from a 50 nm thick tantalum nitride (TaN) film and a 350 nm thick Ta film is used in embodiment 1. It is good to form this film by sputtering. Furthermore, if an inert gas such as Xe or Ne is added as a sputtering gas, then film peeling due to the stress can be prevented.

The gate electrodes 313 and 316 are formed at this time so as to overlap a portion of the n-type impurity regions 305 and 306, respectively, sandwiching the gate insulating film 311. This overlapping portion later becomes an LDD region overlapping the gate electrode.

Figure 4A:
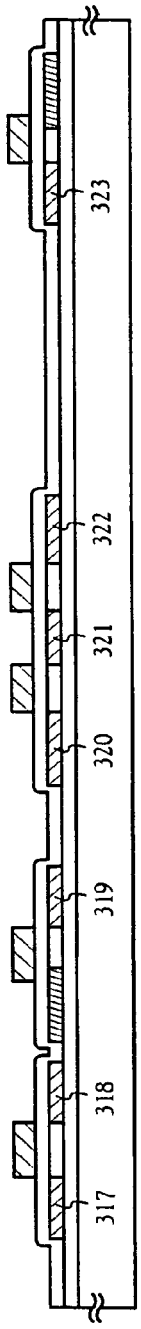
FIGS. 4A to 4D are diagrams showing manufacturing processes of an active matrix type EL display device of Embodiment 1.

Next, an n-type impurity element (phosphorous is used in embodiment 1) is added in a self-aligning manner with the gate electrodes 312 to 316 as masks, as shown in FIG. 4A. The addition is regulated so that phosphorous is added to impurity regions 317 to 323 thus formed at a concentration of 1/10 to 1/2 that of the impurity regions 305 and 306 (typically between 1/4 and 1/3). Specifically, a concentration of $1 \times 10^{16}$ to $5 \times 10^{18}$ atoms/cm$^3$ (typically $3 \times 10^{17}$ to $3 \times 10^{18}$ atoms/cm$^3$) is preferable.

Figure 4B:
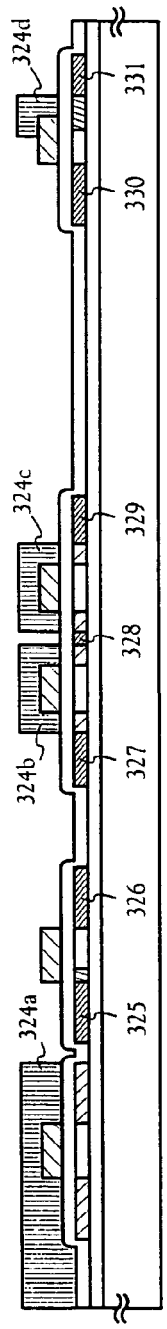

Resist masks 324a to 324d are formed next to cover the gate electrodes, as shown in FIG. 4B, and an n-type impurity element (phosphorous is used in embodiment 1) is added, forming impurity regions 325 to 331 containing a high concentration of phosphorous. Ion doping using phosphine ($PH_3$) is also performed here, and is regulated so that the phosphorous concentration of these regions is from $1 \times 10^{20}$ to $1 \times 10^{21}$ atoms/cm$^3$ (typically between $2 \times 10^{20}$ and $5 \times 10^{20}$ atoms/cm$^3$).

A source region or a drain region of the n-channel TFT is formed by this process, and in the switching TFT, a portion of the n-type impurity regions 320 to 322 formed by the process of FIG. 4A remains. These remaining regions correspond to the LDD regions 15a to 15d of the switching TFT in FIG. 1.

Figure 4C:
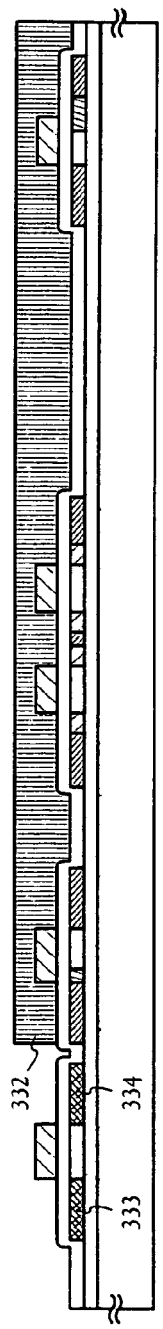
Figure 4D:
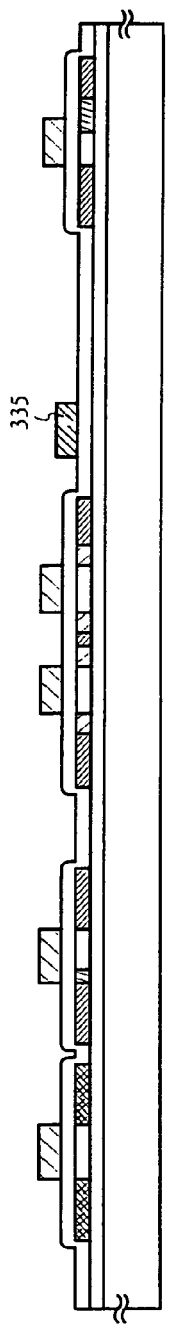

Next, as shown in FIG. 4C, the resist masks 324a to 324d are removed, and a new resist mask 332 is formed. A p-type impurity element (boron is used in embodiment 1) is then added, forming impurity regions 333 and 334 containing a high concentration of boron. Boron is added here to a concentration of $3 \times 10^{20}$ to $3 \times 10^{21}$ atoms/cm$^3$ (typically between $5 \times 10^{20}$ and $1 \times 10^{21}$ atoms/cm$^3$) by ion doping using diborane ($B_2H_6$).

Note that phosphorous has already been added to the impurity regions 333 and 334 at a concentration of $1 \times 10^{16}$ to $5 \times 10^{18}$ atoms/cm$^3$, but boron is added here at a concentration of at least 3 times that of the phosphorous. Therefore, the n-type impurity regions already formed completely invert to p-type, and function as p-type impurity regions.

Next, after removing the resist mask 332, the n-type and p-type impurity elements added at various concentrations are activated. Furnace annealing, laser annealing, or lamp annealing may be performed as a means of activation. Heat treatment is performed in embodiment 1 in a nitrogen atmosphere for 4 hours at 550° C. in an electric furnace.

It is important to remove as much of the oxygen in the atmosphere as possible at this time. This is because if any oxygen exists, then the exposed surface of the electrode oxidizes, inviting an increase in resistance, and at the same time it becomes more difficult to later make an ohmic contact. It is therefore preferable that the concentration of oxygen in the atmosphere in the above activation process be 1 ppm or less, desirably 0.1 ppm or less.

After the activation process is completed, a gate wiring 335 with a thickness of 300 nm is formed next. A metallic film having aluminum (Al) or copper (Cu) as its principal constituent (comprising 50 to 100% of the composition) may be used as the material of the gate wiring 335. As with the gate wiring 211 of FIG. 2, the gate wiring 335 is formed with a placement so that the gate electrodes 314 and 315 of the switching TFTs (corresponding to gate electrodes 19a and 19b of FIG. 2) are electrically connected. (See FIG. 4D.

The wiring resistance of the gate wiring can be made extremely small by using this type of structure, and therefore a pixel display region (pixel portion) having a large surface area can be formed. Namely, the pixel structure of embodiment 1 is extremely effective because an EL display device having a screen size of a 10 inch diagonal or larger (in addition, a 30 inch or larger diagonal) is realized.

Figure 5A:
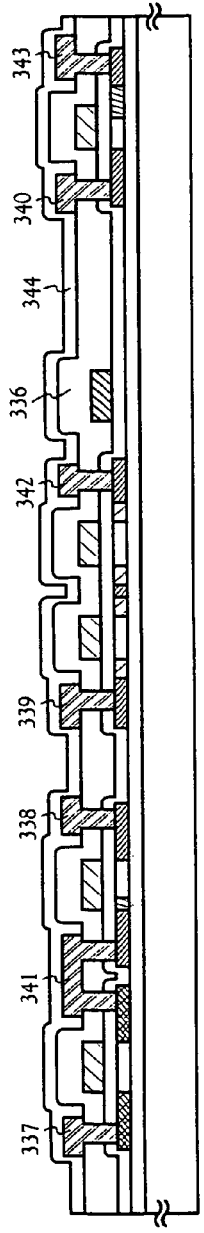
FIGS. 5A to 5C are diagrams showing manufacturing processes of an active matrix type EL display device of Embodiment 1.

A first interlayer insulating film 336 is formed next, as shown in FIG. 5A. A single layer insulating film containing silicon is used as the first interlayer insulating film 336, but a lamination film may be combined in between. Further, a film thickness of between 400 nm and 1.5 μm may be used. A lamination structure of an 800 nm thick silicon oxide film on a 200 nm thick silicon nitride oxide film is used in embodiment 1.

In addition, heat treatment is performed for 1 to 12 hours at 300 to 450° C. in an atmosphere containing between 3 and 100% hydrogen, performing hydrogenation. This process is one of hydrogen termination of dangling bonds in the semiconductor film by hydrogen which is thermally activated. Plasma hydrogenation (using hydrogen activated by a plasma) may also be performed as another means of hydrogenation.

Note that the hydrogenation step may also be inserted during the formation of the first interlayer insulating film 336.

Namely, hydrogen processing may be performed as above after forming the 200 nm thick silicon nitride oxide film, and then the remaining 800 nm thick silicon oxide film may be formed.

A contact hole is formed next in the first interlayer insulating film 336, and source wirings 337 to 340, and drain wirings 341 to 343 are formed. In embodiment 1, a lamination film with a three layered structure of a 100 nm titanium film, a 300 nm aluminum film containing titanium, and a 150 nm titanium film, formed successively by sputtering, is used as these wirings. Other conducting films may also be used, of course, and an alloy film containing silver, palladium, and copper may also be used.

A first passivation film 344 is formed next with a thickness of 50 to 500 nm (typically between 200 and 300 nm). A 300 nm thick silicon nitride oxide film is used as the first passivation film 344 in embodiment 1. This may also be substituted by a silicon nitride film. It is of course possible to use the same materials as those of the first passivation film 41 of FIG. 1.

Note that it is effective to perform plasma processing using a gas containing hydrogen such as $H_2$ or $NH_3$ before the formation of the silicon nitride oxide film. Hydrogen activated by this preprocess is supplied to the first interlayer insulating film 336, and the film quality of the first passivation film 344 is improved by performing heat treatment. At the same time, the hydrogen added to the first interlayer insulating film 336 diffuses to the lower side, and the active layers can be hydrogenated-effectively.

A second interlayer insulating film 347 is formed next from an organic resin. Materials such as polyimide, polyamide, acrylic, and BCB (benzocyclobutene) can be used as the organic resin. In particular, the purpose of being a leveling film is strong in the second interlayer insulating film 347, and therefore acrylic, having superior leveling characteristics, is preferable. An acrylic film is formed in embodiment 1 with a film thickness which can sufficiently level the step due to TFTs. This thickness is preferably from 1 to 5 µm (more preferably between 2 and 4 µm).

Next, a second passivation film 348 having a thickness of 100 nm is formed on the second interlayer insulating film 347. In this embodiment, since an insulating film containing Si, Al, N, O and La is used, it is possible to prevent alkaline metal from diffusing from the EL layer provided thereon. At the same time, intrusion of moisture into the EL layer is blocked and heat generated in the EL layer is dissipated, so that it is possible to suppress deterioration of the EL layer due to heat and deterioration of the flattened film (second interlayer insulating film).

Then, a contact hole reaching the drain wiring line 343 is formed through the second passivation film 348, the second interlayer insulating film 347, and the first passivation film 344, and a pixel electrode 349 is formed. In this embodiment, a compound film of indium oxide and tin oxide (ITO) is formed to a thickness of 110 nm, and patterning is carried out to make the pixel electrode. This pixel electrode 349 becomes an anode of the EL element. As other materials, it is also possible to use a compound film of indium oxide and zinc oxide or a zinc oxide film containing gallium oxide.

Incidentally, this embodiment has such a structure that the pixel electrode 349 is electrically connected to the drain region 331 or the current controlling TFT through the drain wiring line 343. This structure has merits as follows:

Since the pixel electrode 349 comes in direct contact with an organic material of an EL layer (light emitting layer) or charge transporting layer, there is a possibility that a movable ion contained in the EL layer or the like diffuses in the pixel electrode. That is, in the structure of this embodiment, the pixel electrode 349 is not directly connected to the drain region 331 which is a part of the active layer, but the wiring line 343 is made to intervene so that penetration of the movable ion into the active layer can be prevented.

Figure 5B:
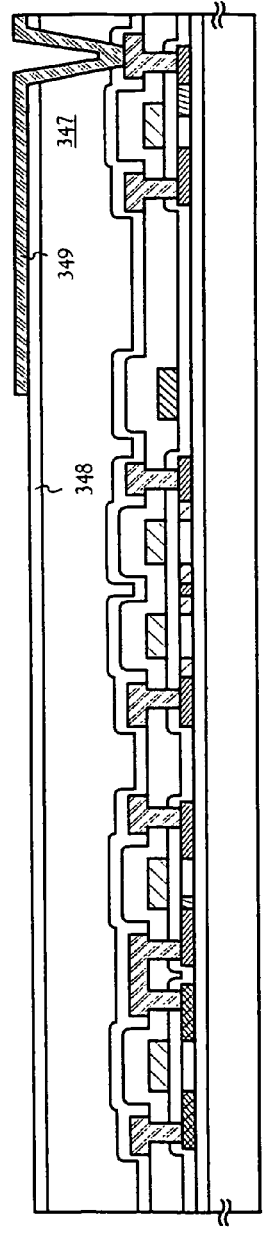
Figure 5C:
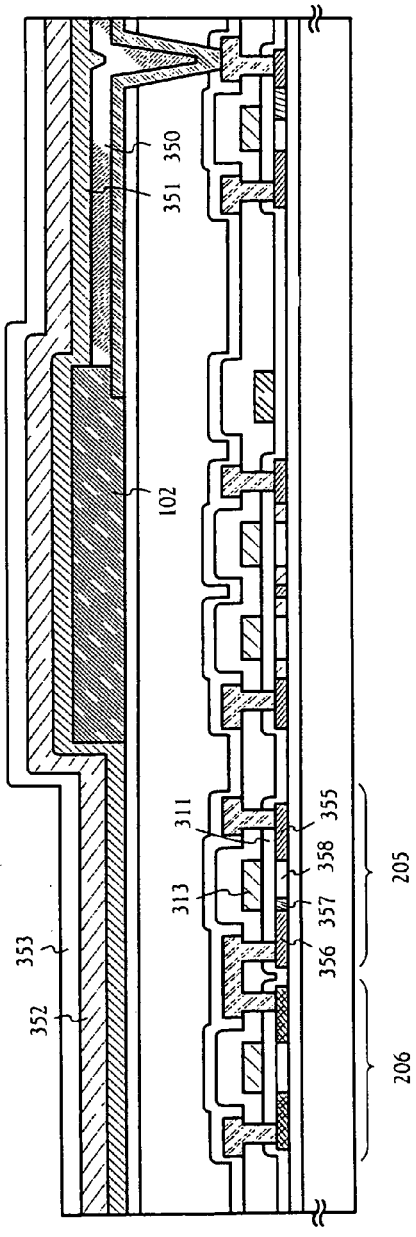

Next, as shown in FIG. 5C, an EL layer 350 is formed by the ink-jet method, and further, a cathode (MgAg electrode) 351 and a protection electrode 352 are formed without exposure to the air. At this time, it is preferable that prior to formation of the EL layer 350 and the cathode 351, a heat treatment is carried out to the pixel electrode 349 to completely remove moisture. Incidentally, in this embodiment, although the MgAg electrode is used as the cathode of the EL element, another well-known material may be used.

Figure 21:
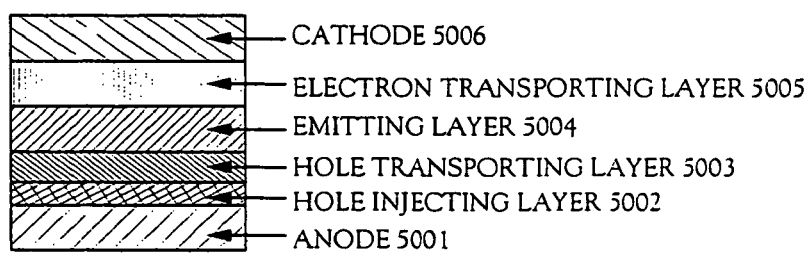
FIG. 21 is a diagram showing laminate structure of EL layers of Embodiment 1.

Incidentally, for the EL layer 350, it is possible to use materials described before. In this embodiment, as shown in FIG. 21, a four-layer structure of a hole injecting layer 5002, a hole transporting layer 5003, an emitting layer 5004, and an electron transporting layer 5005 forms the EL layer. However, there is also a case where the electron transporting layer is not provided, or there is also a case where an electron injecting layer is provided. Besides, there is also a case where the hole injecting layer is omitted. Like this, various examples of combination have already been reported, and any structure of them may be used. Further, in FIG. 21, reference numeral 5001 indicates an anode and 5006 indicates a cathode.

As the hole injecting layer or hole transporting layer, it is appropriate that amine TPD (triphenylamines) is used, and in addition, hydrazone (typically DEH), stilbene (typically STB), starburst (typically m-MTDATA) or the like may be used. Especially, a starburst material having high glass transition temperature and hard to crystallize is preferable. Besides, polyaniline (PAni), polythiophene (PEDOT), or copper phthalocyanine (CuPc) may be used.

Besides, as the light emitting layer used in this embodiment, it is appropriate that cyanopolyphenylene vinylene is used for a light emitting layer radiating red light, polyphenylene vinylene is used for a light emitting layer radiating green light, and polyphenylene vinylene or polyalkylphenylene is used for a light emitting layer radiating blue light. It is appropriate that its film thickness is made 30 to 150 nm (preferably 40 to 100 nm). Besides, in this embodiment, toluene is used as the solvent.

Although even the protective electrode 352 can protect the EL layer 350 from moisture or oxygen, more preferably, a third passivation film 353 may be provided. In this embodiment, as the third passivation film 353, a silicon nitride film having a thickness of 300 nm is provided. This third passivation film may also be formed continuously after the protective electrode 352 without exposure to the air. Of course, as the third passivation film 353, the same material as the third passivation film 50 of FIG. 1 may be used. Besides, the protective electrode 352 is provided to prevent deterioration of the MgAg electrode 351, and a metal film containing aluminum as its main ingredient is typical. Of course, other materials may be used too. Since the EL layer 350 and the MgAg electrode 351 are very weak to moisture, it is desirable to make continuous formation to the protective electrode 352 without exposure to the air so that the EL layer is protected from the outside air.

Incidentally, it is appropriate that the thickness of the EL layer 350 is made 10 to 400 nm (typically 60 to 160 nm), and the thickness of the MgAg electrode 351 is made 180 to 300 nm (typically 200 to 250 nm). In the case where the EL layer 350 is made a laminate structure, it is appropriate that the thickness of each layer is made within a range of 10 to 100 nm.

In this way, an active matrix type EL display device having a structure as shown in FIG. 5C is completed. In the active matrix type EL display device of this embodiment, TFTs having an optimum structure are disposed in not only the pixel portion but also the driving circuit portion, so that very high reliability is obtained and operation characteristics can also be improved.

First, a TFT having a structure to reduce hot carrier injection without decreasing the operation speed thereof as much as possible is used as an n-channel TFT 205 of a CMOS circuit forming a driving circuit. Incidentally, the driving circuit here includes a shift register, a buffer, a level shifter, a sampling circuit (transfer gate) and the like. In the case where digital driving is made, a signal conversion circuit such as a D/A converter can also be included. In the case of this embodiment, as shown in FIG. 5C, the active layer of the n-channel TFT 205 includes a source region 355, a drain region 356, an LDD region 357 and a channel forming region 358, and the LDD region 357 overlaps with the gate electrode 313, by interposing the gate insulating film 311 therebetween.

Consideration not to drop the operation speed is the reason why the LDD region is formed at only the drain region side. In this n-channel TFT 205, it is not necessary to pay attention to an off current value very much, rather, it is better to give importance to an operation speed. Thus, it is desirable that the LDD region 357 is made to completely overlap with the gate electrode to decrease a resistance component to a minimum. That is, it is preferable to remove the so-called offset.

In the p-channel TFT 206 of the CMOS circuit, since deterioration due to hot carrier injection can be almost neglected, an LDD region does not have to be particularly provided. Of course, similarly to the n-channel TFT 205, it is also possible to provide an LDD region to take a countermeasure against hot carriers.

Incidentally, a sampling circuit among driving circuits is rather specific as compared with other circuits, and a large current flows through a channel forming region in both directions. That is, the roles of a source region and a drain region are counter changed. Further, it is necessary to suppress an off current value to the lowest possible value, and in that meaning, it is desirable to dispose a TFT having an approximately intermediate function between the switching TFT and the current controlling TFT.

Figure 9:
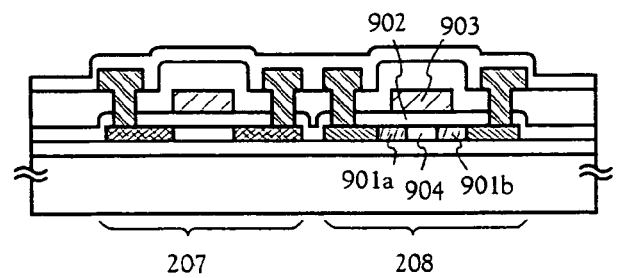
FIG. 9 is a diagram showing the element structure of a sampling circuit of an EL display device of Embodiment 1.

Thus, as an n-channel TFT forming the sampling circuit, it is preferable to dispose a TFT having a structure as shown in FIG. 9. As shown in FIG. 9, parts of LDD regions 901a and 901b overlap with a gate electrode 903, putting a gate insulating film 902 therebetween. This effect is as set forth in the explanation of the current controlling TFT 202, and a different point is that in the sampling circuit, the LDD regions 901a and 901b are provided to be put at both sides of a channel formation region 904.

Besides, a pixel having a structure as shown in FIG. 1 is formed to form a pixel portion. Since the structure of a switching TFT and a current controlling TFT formed in the pixel has already been described in FIG. 1, the description here is omitted.

Note that when the state of FIG. 5C is completed, it is preferable to make packaging (sealing) by a housing member such as a protection film having high air tightness (laminate film, ultraviolet ray curing resin film, etc.) or a ceramic sealing can so as to prevent exposure to the outer air. At that time, when the inside of the housing member is made an inert gas atmosphere, or a moisture absorbent (for example, barium oxide) or an antioxidant is disposed in the inside, the reliability (lifetime) of the EL layer is improved.

After the air tightness is raised by processing such as packaging, a connector (flexible print circuit: FPC) for connecting a terminal extended from the element or circuit formed on the substrate to an external signal terminal is attached so that a product is completed. In the present specification, the EL display device, which is made to have such a state that it can be shipped, is called an EL module.

Here, the structure of the active matrix type EL display device of this embodiment will be described with reference to a perspective view of FIG. 6. The active matrix type EL display device of this embodiment is constituted by a pixel portion 602, a gate side driving circuit 603, and a source side driving circuit 604 formed on a glass substrate 601. A switching TFT 605 of a pixel portion is an n-channel TFT, and is disposed at an intersection point of a gate wiring line 606 connected to the gate side driving circuit 603 and a source wiring line 607 connected to the source side driving circuit 604. The drain of the switching TFT 605 is connected to the gate of a current controlling TFT 608.

Further, the source of the current controlling TFT 608 is connected to a current supply line 609, and an EL element 610 is electrically connected to the drain of the current controlling TFT 608. At this time, if the current controlling TFT 608 is an n-channel TFT, it is preferable that a cathode of the EL element 610 is connected to the drain. If the current controlling TFT 608 is a p-channel TFT, it is preferable that an anode of the EL element 610 is connected to the drain.

Input wiring lines (connection wiring lines) 612 and 613 for transmitting signals to the driving circuits and an input wiring line 614 connected to the current supply line 609 are provided in an FPC 611 as an external input terminal.

Figure 6:
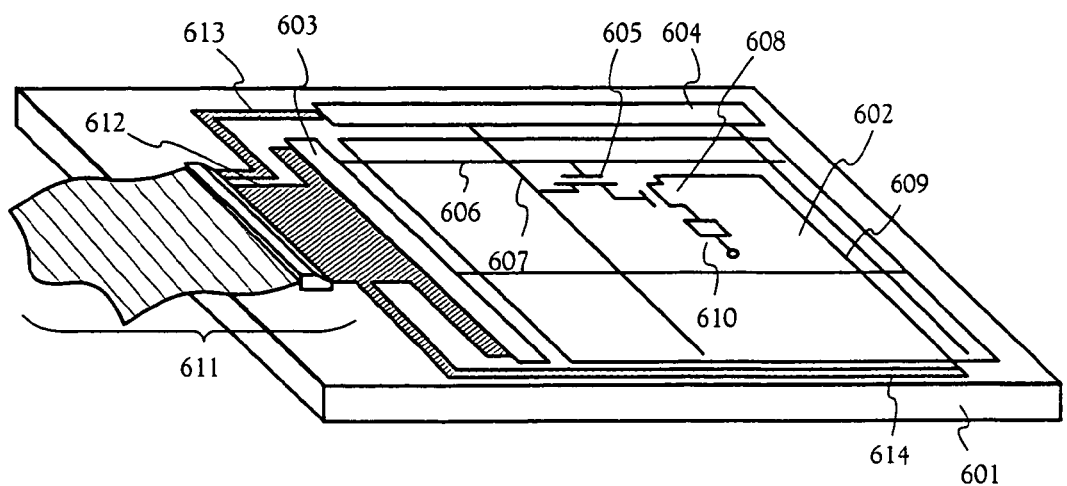
FIG. 6 is a diagram showing an external view of an EL module of Embodiment 1.
Figure 7:
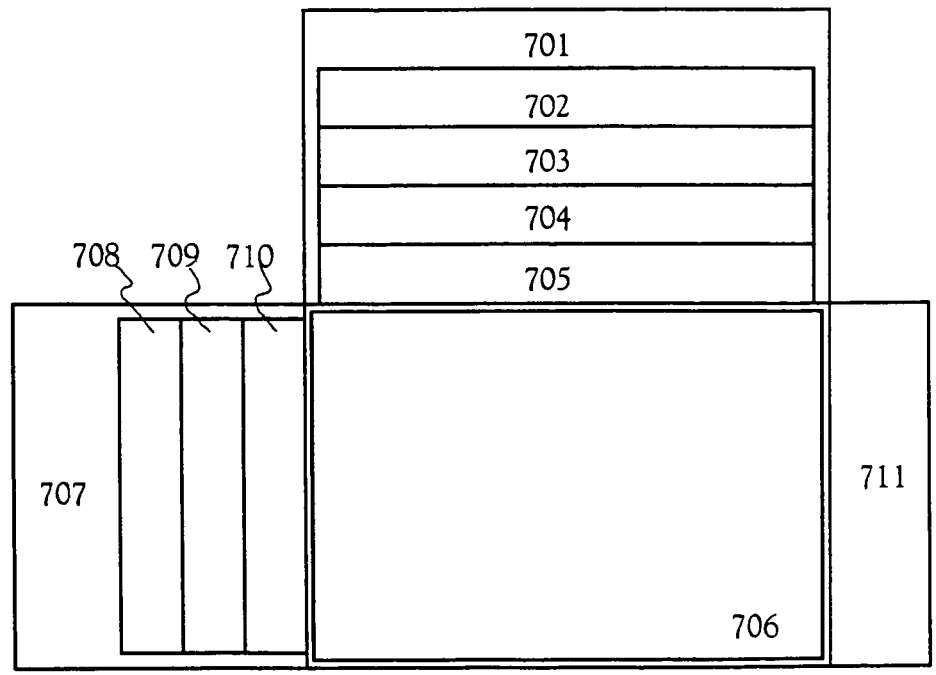
FIG. 7 is a diagram showing the circuit block structure of an EL display device of Embodiment 1.

An example of circuit structure of the EL display device shown in FIG. 6 is shown in FIG. 7. The EL display device of this embodiment includes a source side driving circuit 701, a gate side driving circuit (A) 707, a gate side driving circuit (B) 711, and a pixel portion 706. Incidentally, in the present specification, the term "driving circuit" is a general term including the source side driving circuit and the gate side driving circuit.

The source side driving circuit 701 is provided with a shift register 702, a level shifter 703, a buffer 704, and a sampling circuit (transfer gate) 705. The gate side driving circuit (A) 707 is provided with a shift register 708, a level shifter 709, and a buffer 710. The gate side driving circuit (B) 711 also has the similar structure.

Here, the shift registers 702 and 708 have driving voltages of 5 to 16 V (typically 10 V) respectively, and the structure indicated by 205 in FIG. 5C is suitable for an n-channel TFT used in a CMOS circuit forming the circuit.

Although the driving voltage of each of the level shifters 703 and 709 and the buffers 704 and 710 becomes as high as 14 to 16V, similarly to the shift register, the CMOS circuit including the n-channel TFT 205 of FIG. 5C is suitable. Incidentally, it is effective to make a gate wiring line a multi-gate structure such as a double gate structure or a triple gate structure in improvement of reliability of each circuit.

Although the sampling circuit 705 has a driving voltage of 14 to 16 V, since the source region and drain region are inverted and it is necessary to decrease an off current value, a CMOS circuit including the n-channel TFT 208 of FIG. 9 is suitable.

The pixel portion 706 has a driving voltage of 14 to 16 V, and pixels having the structure shown in FIG. 1 are disposed.

The foregoing structure can be easily realized by manufacturing TFTs in accordance with the manufacturing steps shown in FIGS. 3 to 5. In this embodiment, although only the structure of the pixel portion and the driving circuit are shown, if the manufacturing steps of this embodiment are used, it is possible to form a logic circuit other than the driving circuit, such as a signal dividing circuit, a D/A converter circuit, an operational amplifier circuit, ay-correction circuit, or the like on the same substrate, and further, it is believed that a memory portion, a microprocessor, or the like can be formed.

Figure 17A:
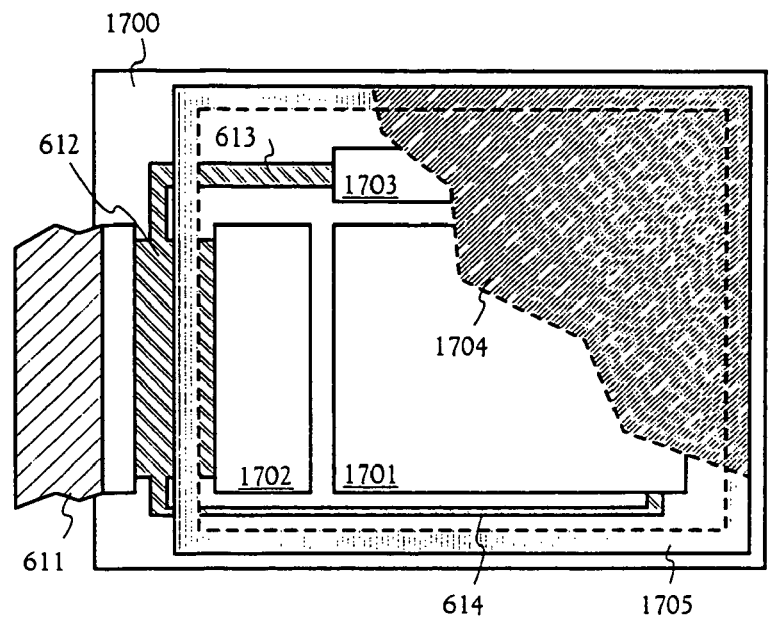
FIGS. 17A and 17B are diagrams showing external views of an EL module of Embodiment 1.
Figure 17B:
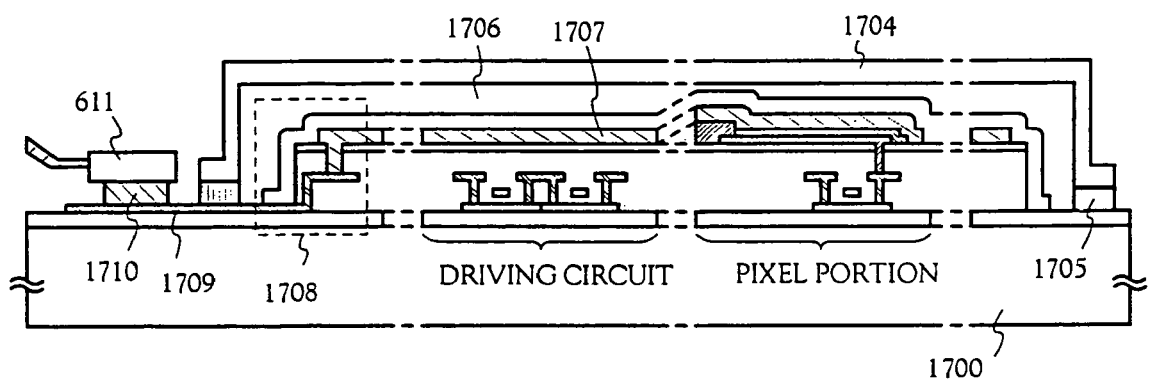

Further, an EL module of this embodiment including a housing member as well will be described with reference to FIGS. 17A and 17B. Incidentally, as needed, reference numbers used in FIGS. 6 and 7 will be cited. In FIG. 17B, detailed structures of TFTs in the driving circuits and the pixel portion are omitted because those were already explained.

A pixel portion 1701, a source side driving circuit 1702, and a gate side driving circuit 1703 are formed on a substrate (including a base film below a TFT) 1700. Various wiring lines from the respective driving circuits lead to an FPC 611 through input wiring lines 612 to 614 and are connected to an external equipment.

At this time, a housing member 1704 is provided to surround at least the pixel portion, preferably the driving circuit and the pixel portion. The housing member 1704 has such a shape as to have a recess portion with an inner size larger than an outer size of the EL element or a sheet shape, and is fixed by an adhesive 1705 to the substrate 1700 so as to form an airtight space in cooperation with the substrate 1700. At this time, the EL element is put in such a state that it is completely sealed in the airtight space, and is completely shut off from the outer air. Incidentally, a plurality of housing members 1704 may be provided.

As a material of the housing member 1704, an insulating material such as glass or polymer is preferable. For example, amorphous glass (boro-silicate glass, quartz, etc.), crystallized glass, ceramic glass, organic resin (acrylic resin, styrene resin, polycarbonate resin, epoxy resin, etc.), and silicone resin are enumerated. Besides, ceramics may be used. If the adhesive 1705 is an insulating material, a metal material such as a stainless alloy can also be used.

As a material of the adhesive 1705, an adhesive of epoxy resin, acrylate resin, or the like can be used. Further, thermosetting resin or photo-curing resin can also be used as the adhesive. However, it is necessary to use such material as to block penetration of oxygen and moisture to the utmost.

Further, it is desirable that a space 1706 between the housing member and the substrate 1700 is filled with an inert gas (argon, helium, nitrogen, etc.). Other than the gas, an inert liquid (liquid fluorinated carbon typified by perfluoroalkane, etc.) can also be used. With respect to the inert liquid, a material as used in Japanese Patent Application Laid-open No. Hei 8-78519 may be used. Besides, resin may be filled.

It is also effective to provide a drying agent in the space 1706. As the drying agent, a material as disclosed in Japanese Patent Application Laid-open No. Hei 9-148066 can be used. Typically, barium oxide may be used. It is also effective to provide not only the drying agent but also an antioxidant.

Besides, as shown in FIG. 17B, a plurality of pixels each including isolated EL elements is provided in a pixel portion, and all of them include a protection electrode 1707 as a common electrode. In this embodiment, although the description has been made such that it is preferable to continuously form the EL layer, the cathode (MgAg electrode) and the protective electrode without opening to the air, if the EL layer and the cathode are formed by using the same mask member, and only the protective electrode is formed by a different mask member, the structure of FIG. 17B can be realized.

At this time, the EL layer and the cathode may be formed on only the pixel portion, and it is not necessary to provide them on the driving circuit. Of course, although a problem does not arise if they are provided on the driving circuit, when it is taken into consideration that alkaline metal is contained in the EL layer, it is preferable not to provide.

Incidentally, the protection electrode 1707 is connected to an input wiring line 1709 in a region indicated by 1708. The input wiring line 1709 is a wiring line to give a predetermined voltage to the protective electrode 1707, and is connected to the FPC 611 through a conductive paste material (anisotropic conductive film) 1710.

Here, manufacturing steps for realizing a contact structure in the region 1708 will be described with reference to FIG. 18.

Figure 18A:
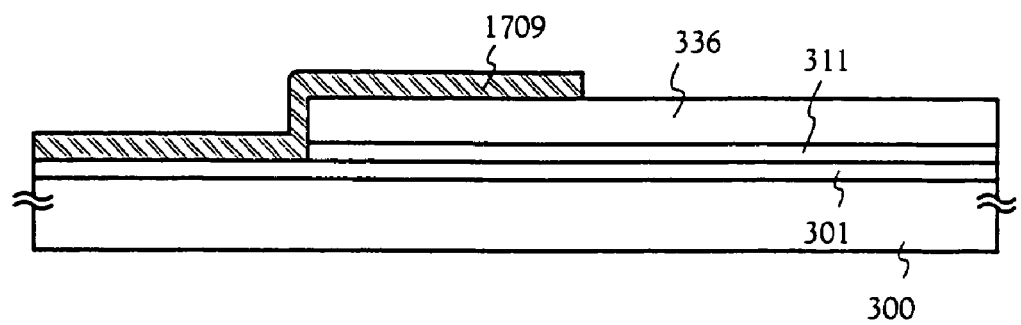
FIGS. 18A to 18C are diagrams showing manufacturing processes of a contact structure of Embodiment 1.

First, in accordance with the steps of this embodiment, the state of FIG. 5A is obtained. At this time, on the edge portion of the substrate (region indicated by 1708 in FIG. 17B), the first interlayer insulating film 336 and the gate insulating film 311 are removed, and an input wiring line 1709 is formed thereon. Of course, it is formed at the same time as the source wiring line and the drain wiring line of FIG. 5A (FIG. 18A).

Figure 18B:
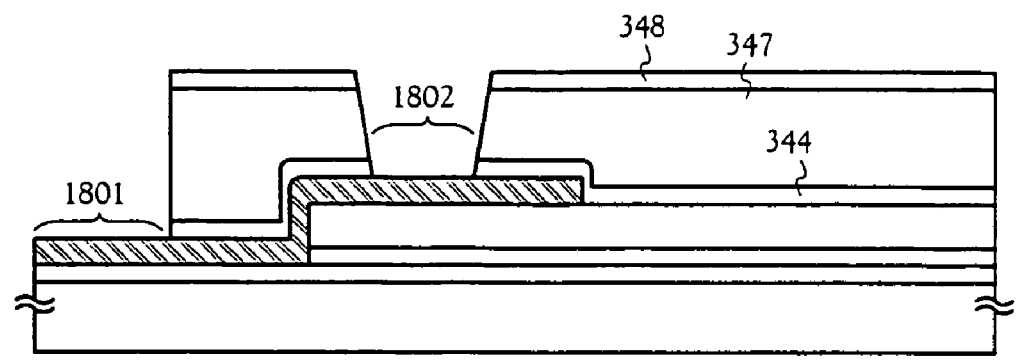
Figure 18C:
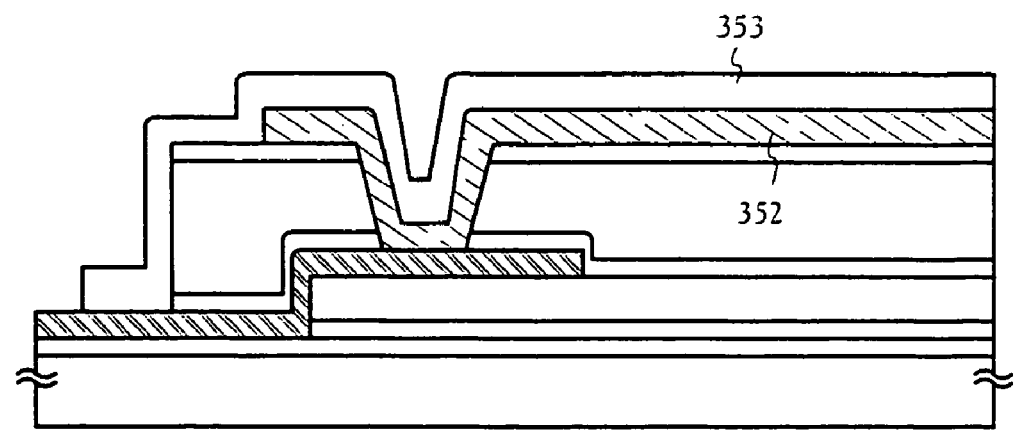

Next, in FIG. 5B, when the second passivation film 348, the second interlayer insulating film 347, and the first passivation film 344 are etched in FIG. 5B, a region indicated by 1801 is removed, and an opening portion 1802 is formed (FIG. 18B).

In this state, in the pixel portion, a forming step of an EL element (forming step of a pixel electrode, an EL layer and a cathode) is carried out. At this time, in the region shown in FIG. 18, a mask member is used so that the EL element is not formed. After a cathode 351 is formed, a protective electrode 352 is formed by using another mask member. By this, the protective electrode 352 and the input wiring line 1709 are electrically connected. Further, a third passivation film 353 is provided to obtain the state of FIG. 18C.

Through the foregoing steps, the contact structure of the region indicated by 1708 of FIG. 17B is realized. The input wiring line 1709 is connected to the FPC 611 through a gap between the housing member 1704 and the substrate 1700 (however, the gap is filled with the adhesive 1705. That is, the adhesive 1705 is required to have such a thickness as to be able to sufficiently flatten unevenness due to the input wiring line). Incidentally, although the description has been made here on the input wiring line 1709, other output wiring lines 612 to 614 are also connected to the FPC 611 through the portion under the housing member 1704 in the same manner.

Embodiment 2

Figure 10:
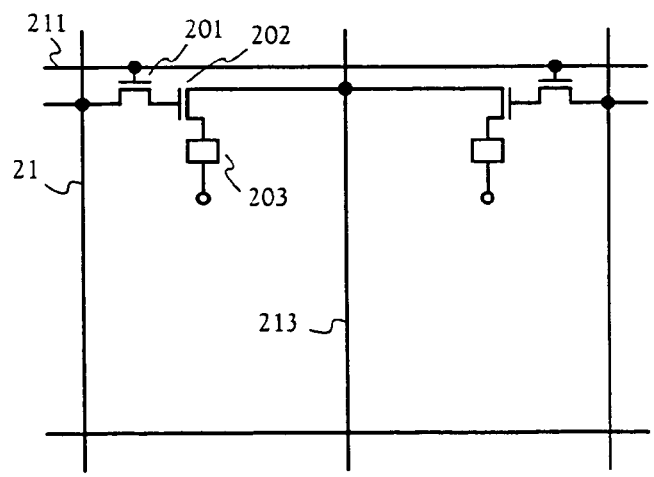
FIG. 10 is a diagram showing the composition of the pixel portion of an EL display device of Embodiment 2.

In this embodiment, an example in which a structure of a pixel is made different from the structure shown in FIG. 2B will be described with reference to FIG. 10.

In this embodiment, two pixels shown in FIG. 2B are arranged to become symmetrical with respect to a current supply line. That is, as shown in FIG. 10, a current supply line 213 is made common to two adjacent pixels, so that the number of necessary wiring lines can be reduced. Incidentally, a TFT structure or the like arranged in the pixel may remain the same.

If such structure is adopted, it becomes possible to manufacture a more minute pixel portion, and the quality of an image is improved.

Incidentally, the structure of this embodiment can be easily realized in accordance with the manufacturing steps of the embodiment 1, and with respect to the TFT structure or the like, the description of the embodiment 1 or FIG. 1 may be referred to.

Embodiment 3

Figure 11:
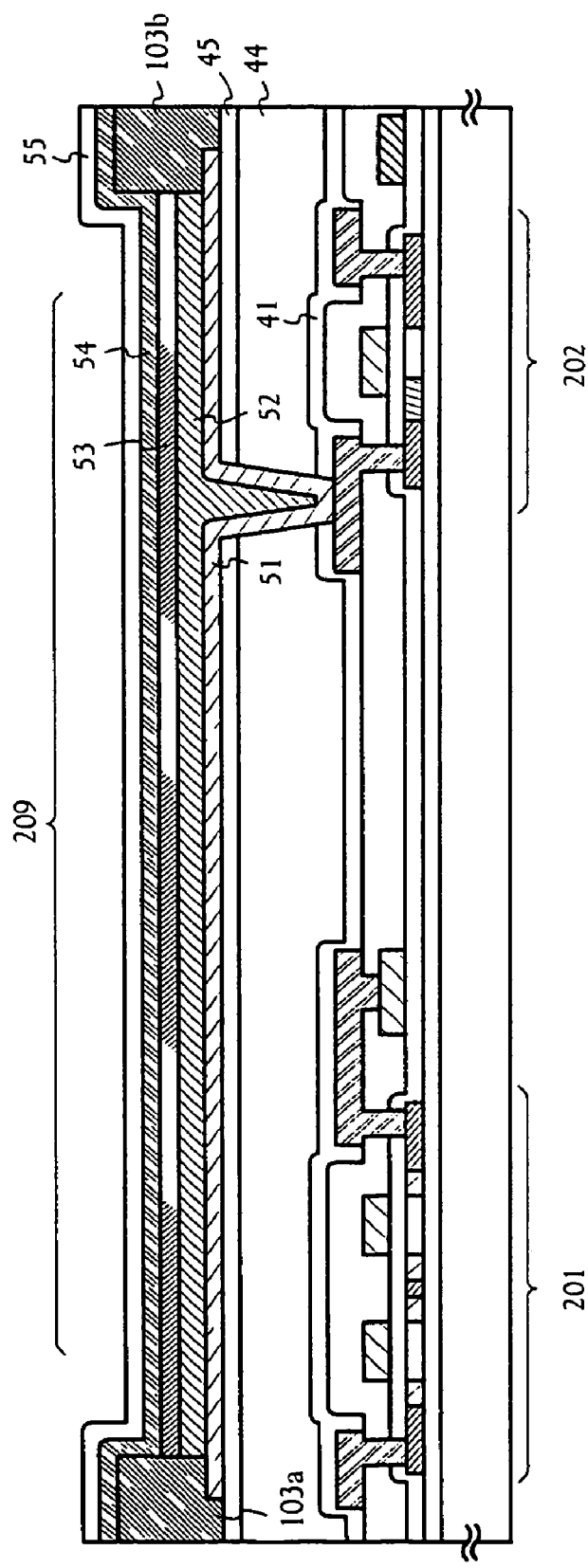
FIG. 11 is a diagram showing the cross sectional structure of an EL display device of Embodiment 3.

In this embodiment, a case where a pixel portion having a structure different from FIG. 1 will be described with reference to FIG. 11. Incidentally, steps up to a step of forming a second interlayer insulating film 44 may be carried out in accordance with the embodiment 1. Since a switching TFT 201 and a current controlling TFT 202 covered with the second interlayer insulating film 44 have the same structure as that in FIG. 1, the description here is omitted.

In the case of this embodiment, after a contact hole is formed through the second passivation film 45, the second interlayer insulating film 44, and the first passivation film 41, a pixel electrode 51 and banks 103a and 103b are formed, and then, a cathode 52 and an EL layer 53 are formed. In this embodiment, after the cathode 52 is formed by vacuum evaporation, the EL layer 53 is formed by an ink-jet method without exposure to the air while a dried inert atmosphere is kept. At this time, a red light emitting EL layer, a green light emitting EL layer, and a blue light emitting EL layer are formed in different pixels by the banks 103a and 103b. Incidentally, although only one pixel is shown in FIG. 11, pixels having the same structure are formed correspondingly to the respective colors of red, green and blue, and accordingly color display can be made. A well-known material may be adopted for the EL layer of each color.

In this embodiment, an aluminum alloy film (aluminum film containing titanium of 1 wt %) having a thickness of 150 nm is provided as the pixel electrode 51. As a material of the pixel electrode, although any material may be used as long as it is a metal material, it is preferable that the material has high reflectivity. A MgAg electrode having a thickness of 230 nm is used as the cathode 52, and the thickness of the EL layer 53 is made 90 nm (from the bottom, an electron transporting layer having a thickness of 20 nm, a light emitting layer having a thickness of 40 nm, and a hole transporting layer having a thickness of 30 nm).

Next, an anode 54 made of a transparent conductive film (in this embodiment, an ITO film) is formed to a thickness of 110 nm. In this way, an EL element 209 is formed, and when a third passivation film 55 is formed by a material shown in the embodiment 1, the pixel having the structure as shown in FIG. 11 is completed.

In the case where the structure of this embodiment is adopted, red, green or blue light generated in each pixel is radiated to a side opposite to the substrate on which the TFT is formed. Thus, almost all regions in the pixel, that is, even the region where the TFT is formed can also be used as an effective light emitting region. As a result, an effective light emitting area of the pixel is greatly improved, and the brightness and contrast ratio (ratio of light to shade) of an image is increased.

Note that the structure of this embodiment can be freely combined with any of the embodiments 1 and 2.

Embodiment 4

Figure 12A:
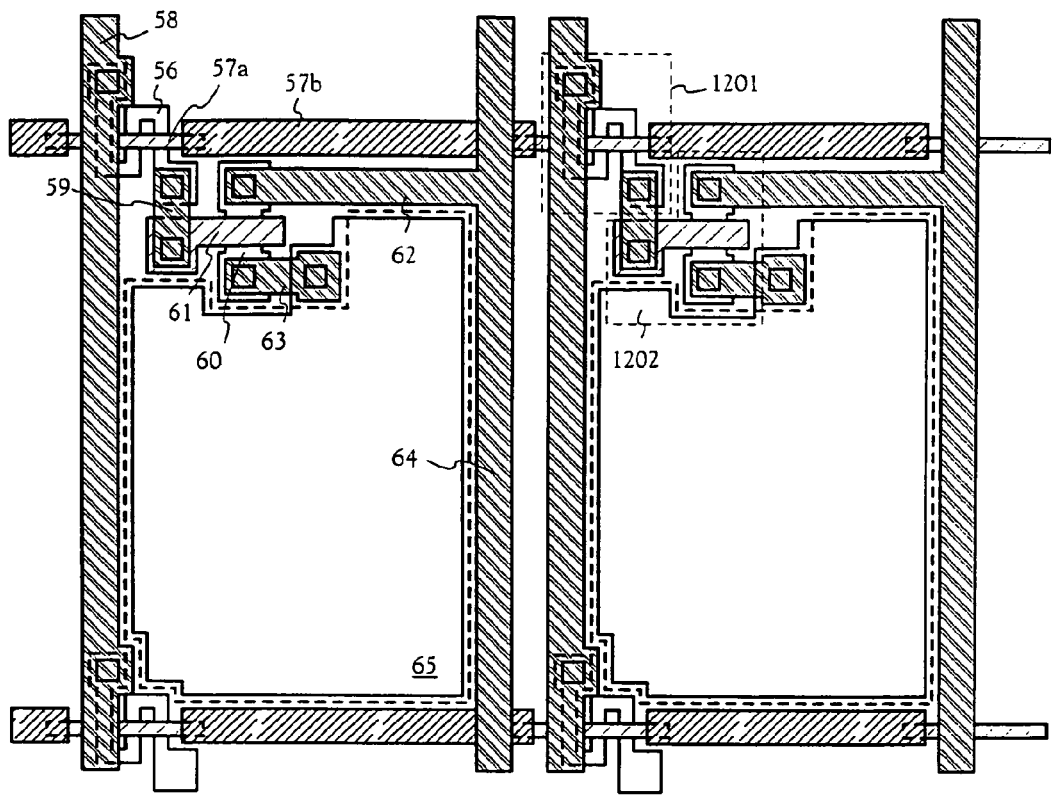
FIGS. 12A and 12B are diagrams showing the top view and the composition, respectively, of the pixel portion of an EL display device of Embodiment 4.
Figure 12B:
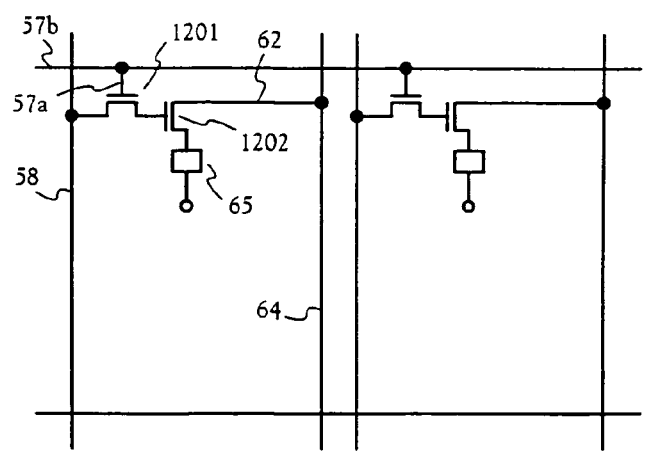

A case of forming a pixel having a structure which differs from that of FIG. 2 of embodiment 1 is explained in embodiment 4 using FIGS. 12A and 12B.

In FIG. 12A, reference numeral 1201 denotes a switching TFT, which comprises an active layer 56, a gate electrode 57a, a gate wiring 57b, a source wiring 58, and a drain wiring 59. Further, reference numeral 1202 denotes a current control TFT, which comprises an active layer 60, a gate electrode 61, a source wiring 62, and a drain wiring 63. The source wiring 62 of the current control TFT 1202 is connected to a current supply line 64, and the drain wiring 63 is connected to an EL element 65. FIG. 12B shows the circuit composition of this pixel.

The different point between FIG. 12A and FIG. 2A is the structure of the switching TFT. In embodiment 4 the gate electrode 57a is formed with a fine line width between 0.1 and 5 μm, and the active layer 56 is formed so as transverse that portion. The gate wiring 57b is formed so as to electrically connect the gate electrode 57a of each pixel. A triple gate structure which does not monopolize much surface area is thus realized.

Other portions are similar to those of FIG. 2A, and the effective emitting surface area becomes larger because the surface area exclusively used by the switching TFT becomes smaller if the structure of embodiment 4 is employed. In other words, the image brightness is increased. Furthermore, a gate structure in which redundancy is increased in order to reduce the value of the off current can be realized, and therefore the image quality can be increased even further.

Note that, in the constitution of embodiment 4, the current supply line 64 can be made common between neighboring pixels, as in embodiment 2, and that a structure like that of embodiment 3 may also be used. Furthermore, processes of manufacturing may be performed in accordance with those of embodiment 1.

Embodiment 5

Cases in which a top gate type TFT is used are explained in embodiments 1 to 4, and the present invention may also be implemented using a bottom gate type TFT. A case of implementing the present invention by using a reverse stagger type TFT is explained in embodiment 5 using FIG. 13. Note that, except for the structure of the TFT, the structure is the same as that of FIG. 1, and therefore the same symbols as those of FIG. 1 are used when necessary.

Figure 13:
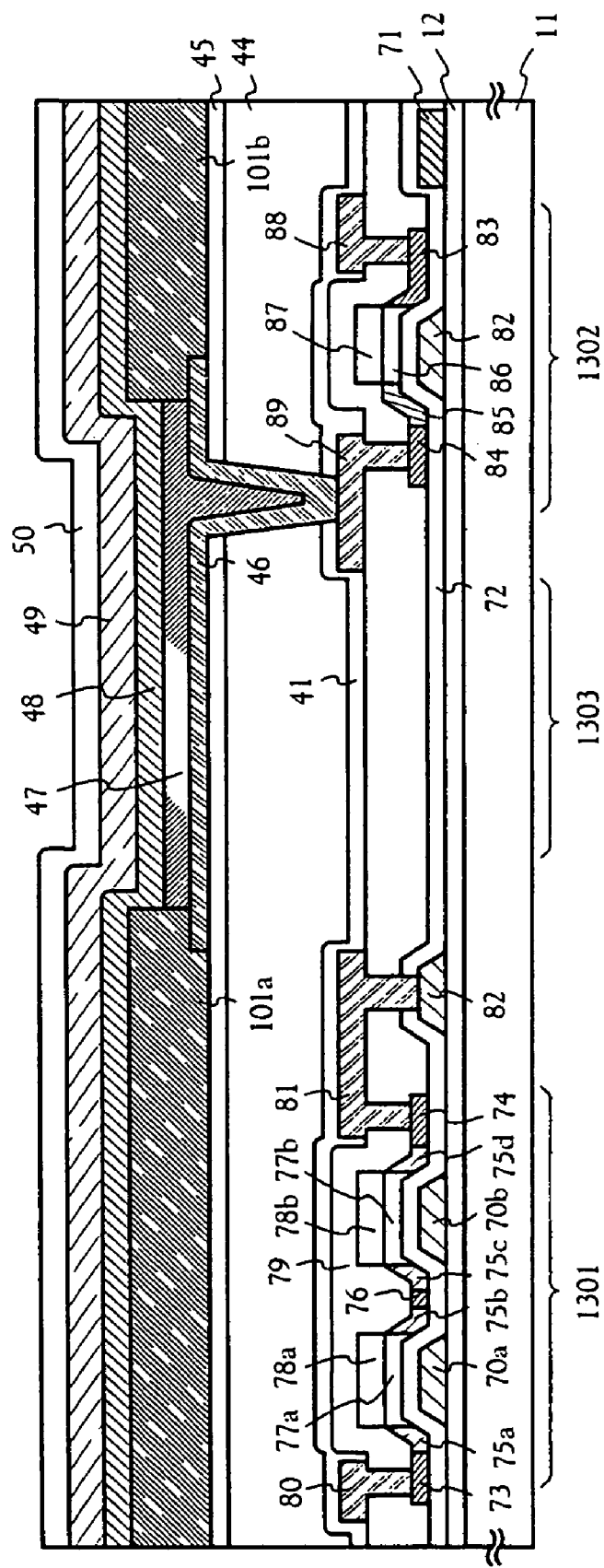
FIG. 13 is a diagram showing the cross sectional structure of the pixel portion of an EL display device of Embodiment 5.

In FIG. 13, the similar materials as those of FIG. 1 can be used in the substrate 11 and in the base film 12. A switching TFT 1301 and a current control TFT 1302 are then formed on the base film 12.

The switching TFT 1301 comprises: gate electrodes 70a and 70b; a gate wiring 71; a gate insulating film 72; a source region 73; a drain region 74; LDD regions 75a to 75d; a high concentration impurity region 76; channel forming regions 77a and 77b; channel protecting films 78a and 78b; a first interlayer insulating film 79; a source wiring 80; and a drain wiring 81.

Further, the current control TFT 1302 comprises: a gate electrode 82; the gate insulating film 72; a source region 83; a drain region 84; an LDD region 85; a channel forming region 86; a channel protecting film 87; a first interlayer insulating film 79; a source wiring 88; and a drain wiring 89. The gate electrode 82 is electrically connected to the drain wiring 81 of the switching TFT 1301 at this point.

Note that the above switching TFT 1301 and the current control TFT 1302 may be formed in accordance with a known method of manufacturing a reverse stagger type TFT. Further, similar materials used in corresponding portions of the top gate type TFTs of embodiment 1 can be used for the materials of each portion (such as wirings, insulating films, and active layers) formed in the above TFTs. Note that the channel protecting films 78a, 78b, and 87, which are not in the constitution of the top gate type TFT, may be formed by an insulating film containing silicon. Furthermore, regarding the formation of impurity regions such as the source regions, the drain regions, and the LDD regions, they may be formed by using a photolithography technique and individually changing the impurity concentration.

When the TFTs are completed, a pixel having an EL element 1303 in which the first passivation film 41, the second interlayer insulating film (leveling film) 44, the second passivation film 45, the pixel electrode (anode) 46, banks 101a and 101b, the EL layer 47, the MgAg electrode (cathode) 48, the aluminum electrode (protecting film) 49, and the third passivation film 50 are formed in order, is completed. Embodiment 1 may be referred to with respect to manufacturing processes and materials for the above.

Note that it is possible to freely combine the constitution of embodiment 5 with the constitution of any of embodiments 2 to 4.

Embodiment 6

It is effective to use a material having a high thermal radiating effect, similar to that of the second passivation film 45, as the base film formed between the active layer and the substrate in the structures of FIG. 5C of embodiment 1 or FIG. 1. In particular, a large amount of current flows in the current control TFT, and therefore heat is easily generated, and deterioration due to self generation of heat can become a problem. Thermal deterioration of the TFT can be prevented by using the base film of embodiment 6, which has a thermal radiating effect, for this type of case.

The effect of protecting from the diffusion of mobile ions from the substrate is also very important, of course, and therefore it is preferable to use a lamination structure of a compound including Si, Al, N, O, and M, and an insulating film containing silicon, similar to the first passivation film 41.

Note that it is possible to freely combine the constitution of embodiment 6 with the constitution of any of embodiments 1 to 5.

Embodiment 7

When the pixel structure shown in embodiment 3 is used, the light emitted from the EL layer is radiated in the direction opposite to the substrate, and therefore it is not necessary to pay attention to the transmissivity of materials, such as the insulating film, which exist between the substrate and the pixel electrode. In other words, materials which have a somewhat low transmissivity can also be used.

It is therefore advantageous to use a carbon film, such as a diamond thin film, a diamond-like carbon film, or an amorphous carbon film, as the base film 12, the first passivation film 41 or the second passivation film 45. In other words, because it is not necessary to worry about lowering the transmissivity, the film thickness can be set thick, to between 100 and 500 nm, and it is possible to have a very high thermal radiating effect.

Regarding the use of the above carbon films in the third passivation film 50, note that a reduction in the transmissivity must be avoided, and therefore it is preferable to set the film thickness to between 5 and 100 nm.

Note that, in embodiment 7, it is effective to laminate with another insulating film when a carbon film is used in any of the base film 12, the first passivation film 41, the second passivation film 49, or the third passivation film 50.

In addition, embodiment 7 is effective when the pixel structure shown in embodiment 3 is used, and for other constitutions, it is possible to freely combine the constitution of embodiment 7 with the constitution of any of embodiments 1 to 6.

Embodiment 8

The amount of the off current value in the switching TFT in the pixel of the EL display device is reduced by using a multi-gate structure for the switching TFT, and the present invention is characterized by the elimination of the need for a storage capacitor. This is a device for making good use of the surface area, reserved for the storage capacitor, as an emitting region.

However, even if the storage capacitor is not completely eliminated, an effect of increasing the effective emitting surface area, by the amount that the exclusive surface area is made smaller, can be obtained. In other words, the object of the present invention can be sufficiently achieved by reducing the value of the off current by using a multi-gate structure for the switching TFT, and by only shrinking the exclusive surface area of the storage capacitor.

Figure 14:
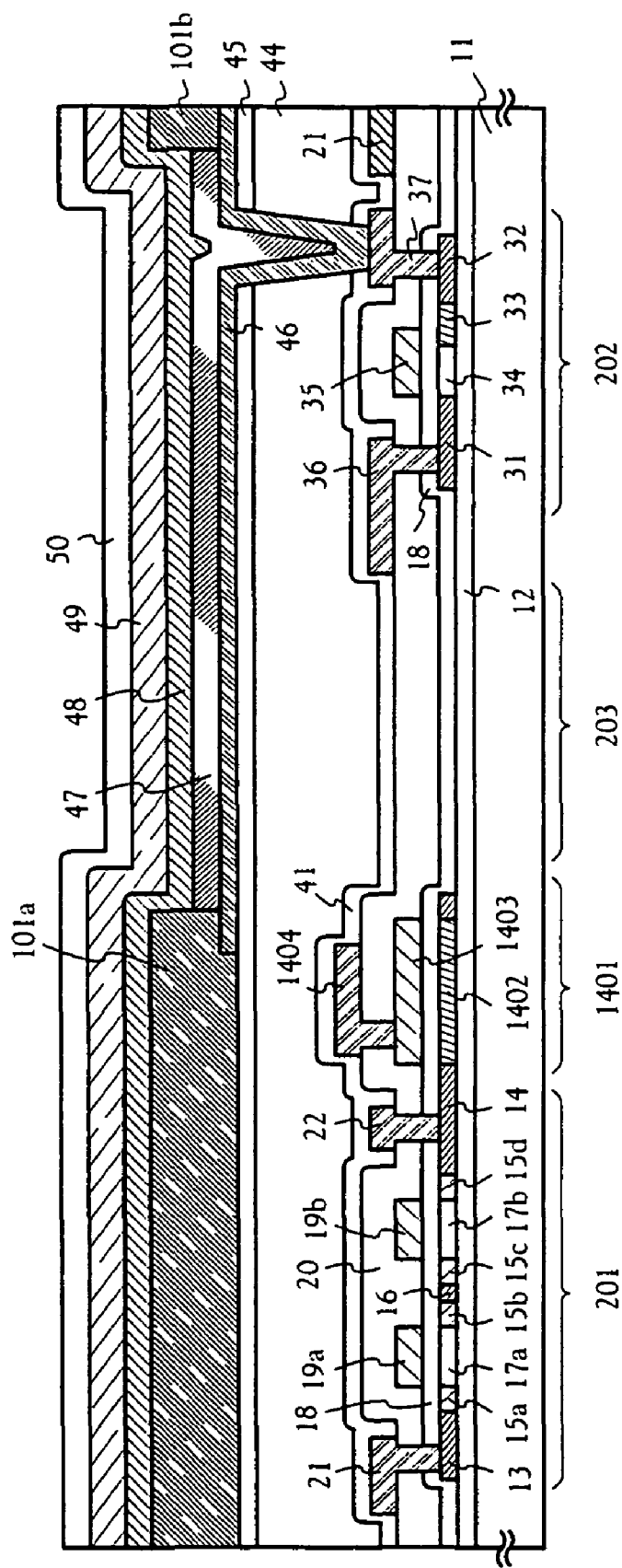
FIG. 14 is a diagram showing the cross sectional structure of the pixel portion of an EL display device of Embodiment 8.

It is therefore possible to use a pixel structure such as that shown in FIG. 14. Note that, when necessary, the same symbols are used in FIG. 14 as in FIG. 1.

The different point between FIG. 14 and FIG. 1 is the existence of a storage capacitor 1401 connected to the switching TFT. The storage capacitor 1401 is formed by a semiconductor region (lower electrode) extended from the drain region 14 of the switching TFT 201, the gate insulating film 18, and a capacitor electrode (upper electrode) 1403. The capacitor electrode 1403 is formed at the same time as the gate electrodes 19a, 19b, and 35 of the TFT.

Figure 15A:
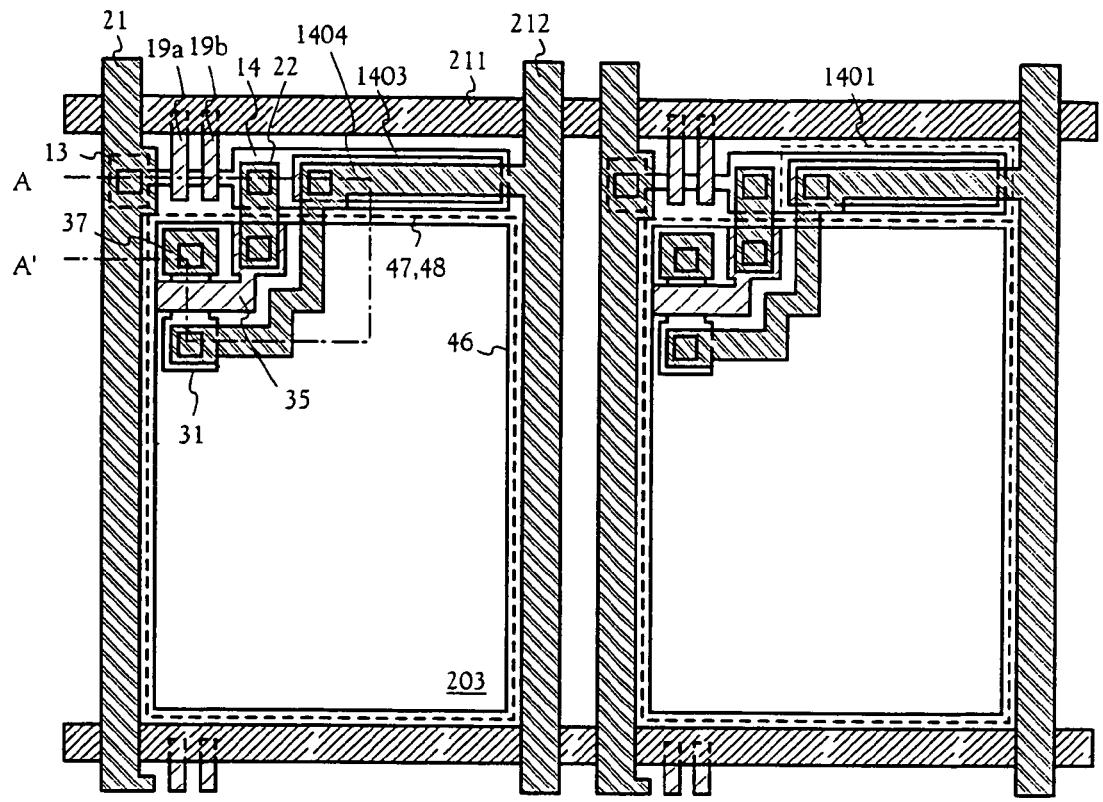
FIGS. 15A and 15B are diagrams showing the top view and the composition, respectively, of the pixel portion of an EL display device of Embodiment 8.
Figure 15B:
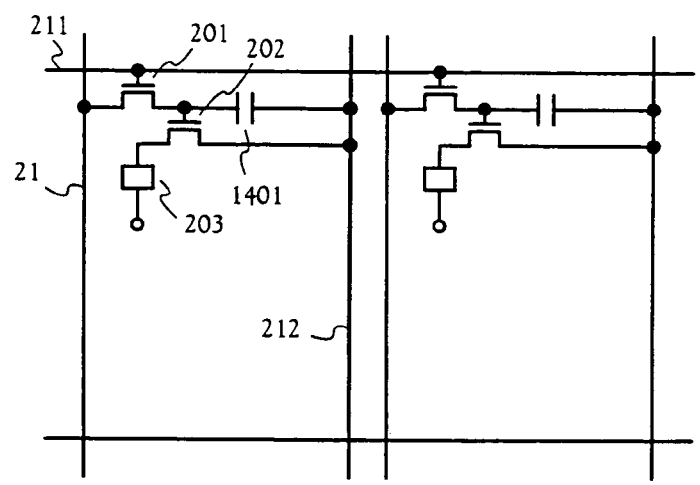

A top view is shown in FIG. 15A. The cross sectional diagram taken along the line A-A' in the top view of FIG. 15A corresponds to FIG. 14. As shown in FIG. 15A, the capacitor electrode 1403 is electrically connected to the source region 31 of the current control TFT through a connecting wiring 1404 which is electrically connected to the capacitor electrode 1403. Note that the connection wiring 1404 is formed at the same time as the source wirings 21 and 36, and the drain wirings 22 and 37. Furthermore, FIG. 15B shows the circuit constitution of the top view shown in FIG. 15A.

Note that the constitution of embodiment 8 can be freely combined with the constitution of any of embodiments 1 to 7. In other words, only the storage capacitor is formed within the pixel, no limitations are added with regard to the TFT structure or the EL layer materials.

Embodiment 9

Laser crystallization is used as the means of forming the crystalline silicon film 302 in embodiment 1, and a case of using a different means of crystallization is explained in embodiment 9.

After forming an amorphous silicon film in embodiment 9, crystallization is performed using the technique recorded in Japanese Patent Application Laid-open No. Hei 7-130652. The technique recorded in the above patent application is one of obtaining a crystalline silicon film having good crystallinity by using an element such as nickel as a catalyst for promoting crystallization.

Further, after the crystallization process is completed, a process of removing the catalyst used in the crystallization may be performed. In this case, the catalyst may be gettered using the technique recorded in Japanese Patent Application Laid-open No. Hei 10-270363 or Japanese Patent Application Laid-open No. Hei 8-330602.

In addition, a TFT may be formed using the technique recorded in the specification of Japanese Patent Application Serial No. Hei 11-076967 by the applicant of the present invention.

The processes of manufacturing shown in embodiment 1 are one embodiment of the present invention, and provided that the structure of FIG. 1 or of FIG. 5C of embodiment 1 can be realized, then other manufacturing process may also be used without any problems, as above.

Note that it is possible to freely combine the constitution of embodiment 9 with the constitution of any of embodiments 1 to 8.

Embodiment 10

In driving the EL display device of the present invention, analog driving can be performed using an analog signal as an image signal, and digital driving can be performed using a digital signal.

When analog driving is performed, the analog signal is sent to a source wiring of a switching TFT, and the analog signal, which contains gray scale information, becomes the gate voltage of a current control TFT. The current flowing in an EL element is then controlled by the current control TFT, the EL element emitting intensity is controlled, and gray scale display is performed. In this case, it is preferable to operate the current control TFT in a saturation region. In other words, it is preferable to operate the TFT within the conditions of $|V_{ds}|>|V_{gs}-V_{th}|$. Note that $V_{ds}$ is the voltage difference between a source region and a drain region, $V_{gs}$ is the voltage difference between the source region and a gate electrode, and $V_{th}$ is the threshold voltage of the TFT.

On the other hand, when digital driving is performed, it differs from the analog type gray scale display, and gray scale display is performed by time division driving (time ratio gray scale driving) or surface area ratio gray scale driving. Namely, by regulating the length of the emission time or the ratio of emitting surface area, color gray scales can be made to be seen visually as changing. In this case, it is preferable to operate the current control TFT in the linear region. In other words, it is preferable to operate the TFT within the conditions of $|V_{ds}|<|V_{gs}-V_{th}|$.

The EL element has an extremely fast response speed in comparison to a liquid crystal element, and therefore it is possible to have high speed driving. Therefore, the EL element is one which is suitable for time ratio gray scale driving, in which one frame is partitioned into a plural number of subframes and then gray scale display is performed. Furthermore, it has the advantage of the period of one frame being short, and therefore the amount of time for which the gate voltage of the current control TFT is maintained is also short, and a storage capacitor can be made smaller or eliminated.

The present invention is a technique related to the element structure, and therefore any method of driving it may thus be used.

Embodiment 11

Figure 23A:
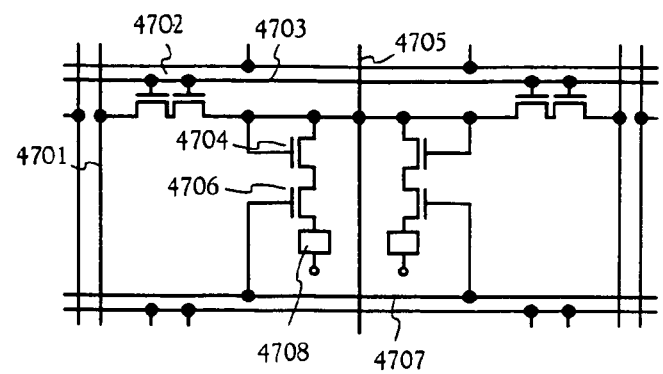
FIGS. 23A and 23B are diagrams showing the circuit composition of the pixel portion of an EL display device of Embodiment 11.
Figure 23B:
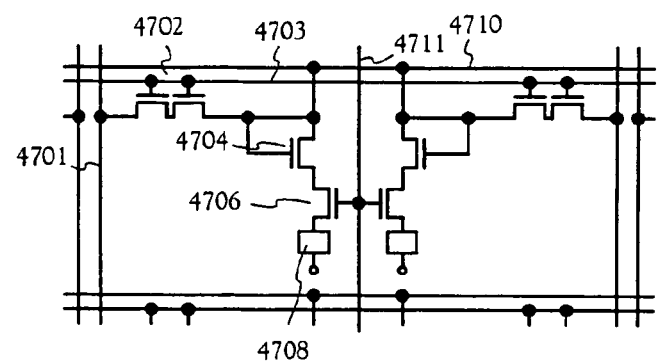

In embodiment 11, examples of the pixel structure of the EL display device of the present invention are shown in FIGS. 23A and 23B. Note that in embodiment 11, reference numeral 4701 denotes a source wiring of a switching TFT 4702, reference numeral 4703 denotes a gate wiring of the switching TFT 4702, reference numeral 4704 denotes a current control TFT, 4705 denotes an electric current supply line, 4706 denotes a power source control TFT, 4707 denotes a power source control gate wiring, and 4708 denotes an EL element. Japanese Patent Application Serial No. Hei 11-341272 may be referred to regarding the operation of the power source control TFT 4706.

Further, in embodiment 11 the power source control TFT 4706 is formed between the current control TFT 4704 and the EL element 4708, but a structure in which the current control TFT 4704 is formed between the power source control TFT 4706 and the EL element 4708 may also be used. In addition, it is preferable for the power source control TFT 4706 to have the same structure as the current control TFT 4704, or for both to be formed in series by the same active layer.

FIG. 23A is an example of a case in which the electric current supply line 4705 is common between two pixels. Namely, this is characterized in that the two pixels are formed having linear symmetry around the electric current supply line 4705. In this case, the number of electric current supply lines can be reduced, and therefore the pixel portion can be made even more high precision.

Furthermore, FIG. 23B is an example of a case in which an electric current supply line 4710 is formed parallel to the gate wiring 4703, and in which a power source control gate wiring 4711 is formed parallel to the source wiring 4701. Note that in FIG. 23B, the structure is formed such that the electric current supply line 4710 and the gate wiring 4703 do not overlap, but provided that both are wirings formed on different layers, then they can be formed to overlap, sandwiching an insulating film. In this case, the exclusive surface area of the electric current supply line 4710 and the gate wiring 4703 can be shared, and the pixel section can be made even more high precision.

Embodiment 12

Figure 24A:
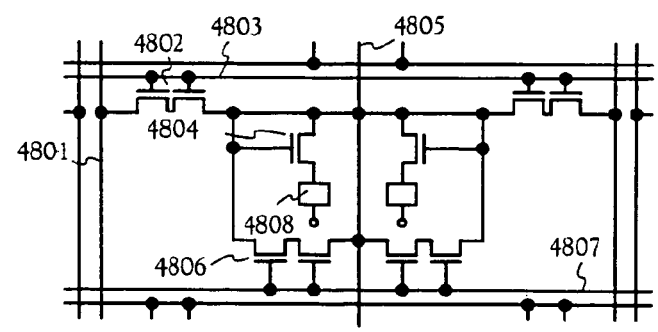
FIGS. 24A and 24B are diagrams showing the circuit composition of the pixel portion of an EL display device of Embodiment 12.
Figure 24B:
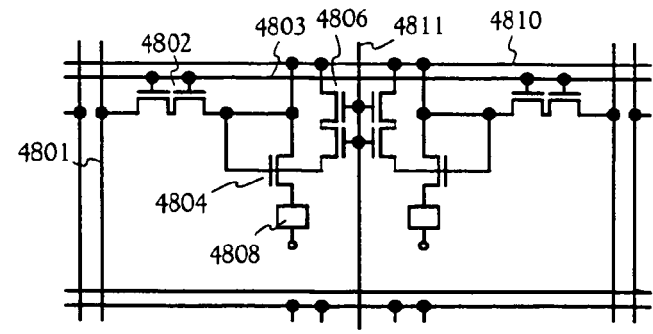

In embodiment 12, examples of the pixel structure of the EL display device of the present invention are shown in FIGS. 24A and 24B. Note that in embodiment 12, reference numeral 4801 denotes a source wiring of a switching TFT 4802, reference numeral 4803 denotes a gate wiring of the switching TFT 4802, reference numeral 4804 denotes a current control TFT, 4805 denotes an electric current supply line, 4806 denotes an erasure TFT, 4807 denotes an erasure gate wiring, and 4808 denotes an EL element. Japanese Patent Application Serial No. Hei 11-338786 may be referred to regarding the operation of the erasure TFT 4806.

The drain of the erasure TFT 4806 is connected to a gate of the current control TFT 4804, and it becomes possible to forcibly change the gate voltage of the current control TFT 4804. Note that an n-channel TFT or a p-channel TFT may be used for the erasure TFT 4806, but it is preferable to make it the same structure as the switching TFT 4802 so that the off current value can be made smaller.

FIG. 24A is an example of a case in which the electric current supply line 4805 is common between two pixels. Namely, this is characterized in that the two pixels are formed having linear symmetry around the electric current supply line 4805. In this case, the number of electric current supply lines can be reduced, and therefore the pixel section can be made even more high precision.

In addition, FIG. 24B is an example of a case in which an electric current supply line 4810 is formed parallel to the gate wiring 4803, and in which an erasure gate wiring 4811 is formed parallel to the source wiring 4801. Note that in FIG. 24B, the structure is formed such that the electric current supply line 4810 an the gate wiring 4803 do not overlap, but provided that both are wirings formed on different layers, then they can be formed to overlap, sandwiching an insulating film. In this case, the exclusive surface area of the electric current supply line 4810 and the gate wiring 4803 can be shared, and the pixel section can be made even more high precision.

Embodiment 13

The EL display device of the present invention may have a structure in which several TFTs are formed within a pixel. In embodiments 11 and 12, examples of forming three TFTs are shown, but from 4 to 6 TFTs may also be formed. It is possible to implement the present invention without placing any limitations on the structure of the pixels of the EL display device.

Embodiment 14

An example of using a p-channel TFT as the current control TFT 202 of FIG. 1 is explained in embodiment 14. Note that other portions are the same as those of FIG. 1, and therefore a detailed explanation of the other portions is omitted.

Figure 25:
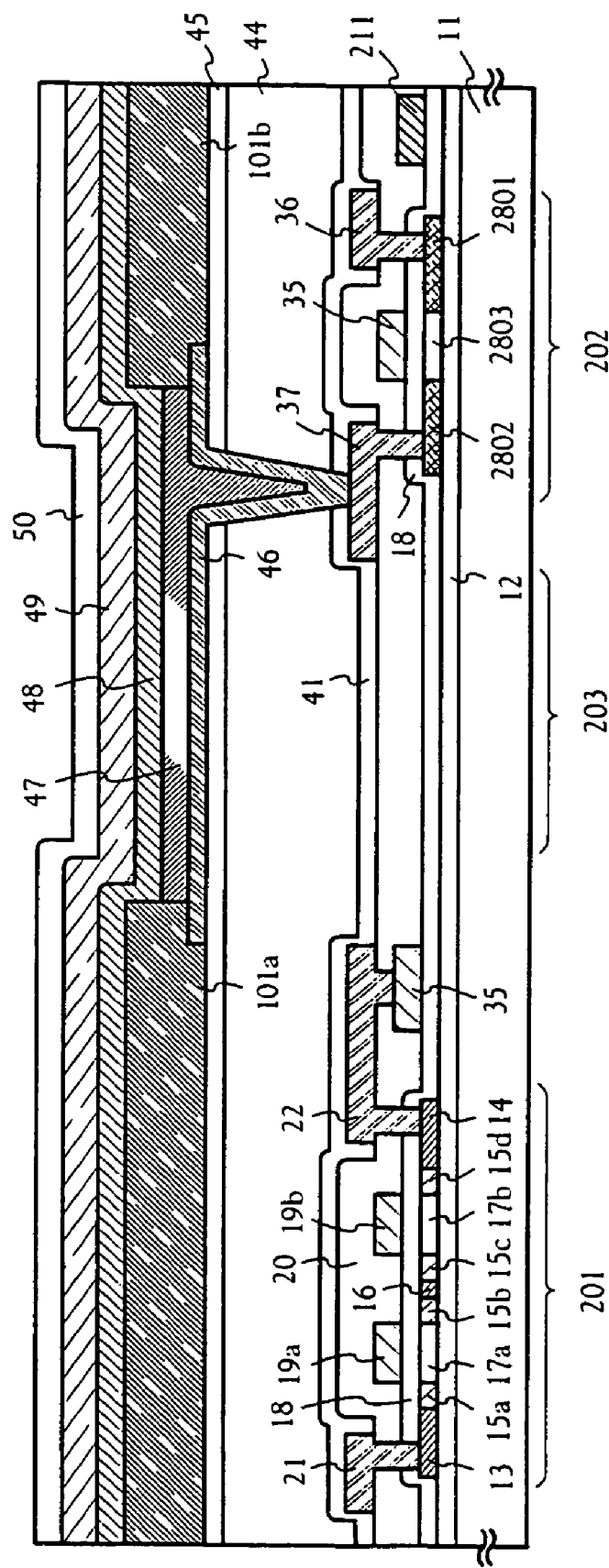
FIG. 25 is a diagram showing the cross sectional structure of the pixel portion of an EL display device of Embodiment 14.

A cross sectional structure of the pixel of embodiment 14 is shown in FIG. 25. Embodiment 1 may be referred to for a method of manufacturing the p-channel TFT used in embodiment 14. An active layer of the p-channel TFT comprises a source region 2801, a drain region 2802, and a channel forming region 2803, and the source region 2801 is connected to the source wiring 36, and the drain region 2802 is connected to the drain wiring 37.

For cases in which the anode of an EL element is connected to the current control TFT, it is preferable to use the p-channel TFT as the current control TFT.

Note that it is possible to implement the constitution of embodiment 14 by freely combining it with the constitution of any of embodiments 1 to 13.

Embodiment 15

By using an EL material in which phosphorescence from a triplet state exciton can be utilized in light emission in embodiment 15, the external emission quantum efficiency can be increased by a great amount. By doing so, it becomes possible to make the EL element into a low power consumption, long life, and low weight EL element.

Reports of utilizing triplet state excitons and increasing the external emission quantum efficiency is shown in the following papers.

Tsutsui, T., Adachi, C., and Saito, S., Photochemical Processes in Organized Molecular Systems, Ed. Honda, K., (Elsevier Sci. Pub., Tokyo, 1991), p. 437.

The molecular formula of the EL material (coumarin pigment) reported in the above paper is shown below.

[Chem 11]

Baldo, M. A., O'Brien, D. F., You, Y., Shoustikov, A., Sibley, S., Thompson, M. E., and Forrest, S. R., Nature 395 (1998) p. 151.

The molecular formula of the EL material (Pt complex) reported in the above paper is shown below.

[Chem 12]

Baldo, M. A., Lamansky,. S., Burrows, P. E., Thompson, M. E., and Forrest, S. R., Appl. Phys. Lett., 75 (1999) p. 4.

Tsutui, T., Yang, M. J., Yahiro, M., Nakamura, K., Watanabe, T., Tsuji, T., Fukuda, Y., Wakimoto, T., Mayaguchi, S., Jpn. Appl. Phys., 38 (12B) (1999) L1502.

The molecular formula of the EL material (Ir complex) reported in the above paper is shown below.

[Chem 13]

Provided that the phosphorescence emission from triplet state excitons can be utilized, then in principle it is possible to realize an external emission quantum efficiency which is 3 to 4 times higher than that for cases of using the fluorescence emission from singlet state excitons. Note that it is possible to implement the constitution of embodiment 15 by freely combining it with the constitution of any of embodiments 1 to 13.

Embodiment 16

In embodiment 1 it is preferable to use an organic EL material as an EL layer, but the present invention can also be implemented using an inorganic EL material. However, current inorganic EL materials have an extremely high driving voltage, and therefore a TFT which has voltage resistance characteristics that can withstand the driving voltage must be used in cases of performing analog driving.

Alternatively, if inorganic EL materials having lower driving voltages than conventional inorganic EL materials are developed, then it is possible to apply them to the present invention.

Further, it is possible to freely combine the constitution of embodiment 16 with the constitution of any of embodiments 1 to 14.

Embodiment 17

An active matrix type EL display device (EL module) formed by implementing the present invention has superior visibility in bright locations in comparison to a liquid crystal display device because it is a self-emitting type device. It therefore has a wide range of uses as a direct-view type EL display (indicating a display incorporating an EL module).

Note that a wide viewing angle can be given as one advantage which the EL display has over a liquid crystal display. The EL display of the present invention may therefore be used as a display (display monitor) having a diagonal equal to 30 inches or greater (typically equal to 40 inches or greater) for appreciation of TV broadcasts by large screen.

Further, not only can it be used as an EL display (such as a personal computer monitor, a TV broadcast reception monitor, or an advertisement display monitor), it can be used as a display for various electronic devices.

The following can be given as examples of such electronic devices: a video camera; a digital camera; a goggle type display (head mounted display); a car navigation system; a personal computer; a portable information terminal (such as a mobile computer, a mobile telephone, or an electronic book); and an image playback device using a recording medium (specifically, a device which performs playback of a recording medium and is provided with a display which can display those images, such as a compact disk (CD), a laser disk (LD), or a digital video disk (DVD)). Examples of these electronic devices are shown in FIGS. 16A to 16F.

Figure 16A:
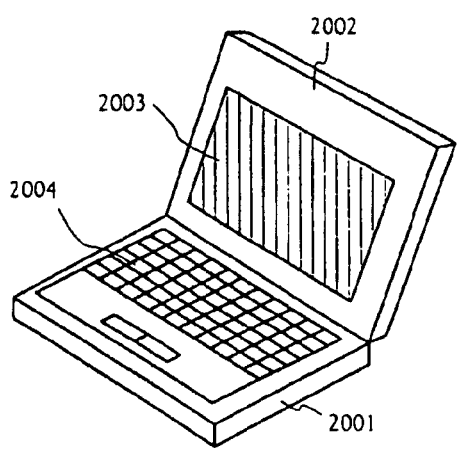
FIGS. 16A to 16F are diagrams showing specific examples of electronic equipment of Embodiment 17.

FIG. 16A is a personal computer, comprising a main body 2001, a casing 2002, a display portion 2003, and a keyboard 2004. The present invention can be used in the display portion 2003.

Figure 16B:
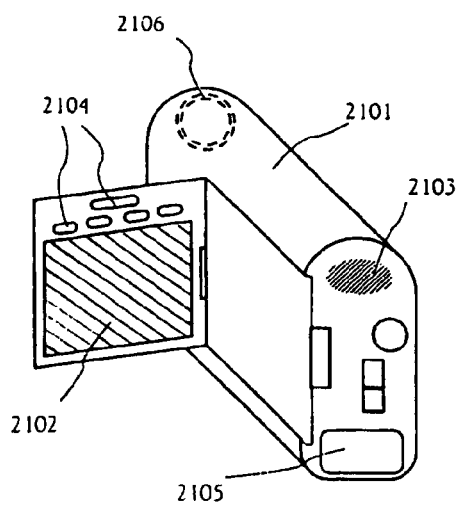

FIG. 16B is a video camera, comprising a main body 2101 a display portion 2102, an audio input portion 2103, operation switches 2104, a battery 2105, and an image receiving portion 2106. The present invention can be used in the display portion 2102.

Figure 16C:
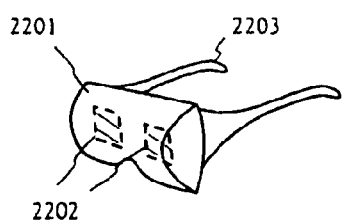

FIG. 16C is a goggle display, comprising a main body 2201, a display portion 2202, and an arm portion 2203. The present invention can be used in the display portion 2202.

Figure 16D:
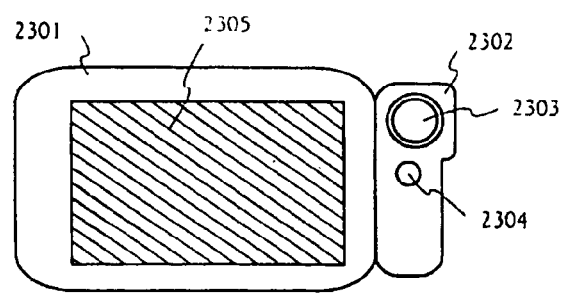

FIG. 16D is a mobile computer, comprising a main body 2301, a camera portion 2302, an image receiving portion 2303, operation switches 2304, and a display portion 2305. The present invention can be used in the display portion 2305.

Figure 16E:
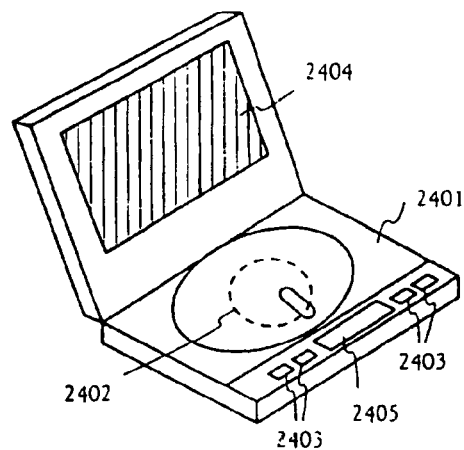

FIG. 16E is an image playback device (specifically, a DVD playback device) provided with a recording medium, comprising a main body 2401, a recording medium (such as a CD, an LD, or a DVD) 2402, operation switches 2403, a display portion (a) 2404, and a display portion (b) 2405. The display portion (a) is mainly used for displaying image information, and the image portion (b) is mainly used for displaying character information, and the present invention can be used in the image portion (a) 2404 and in the image portion (b) 2405. Note that the present invention can be used as an image play back device provided with a recording medium in devices such as a CD playback device and game equipment.

Figure 16F:
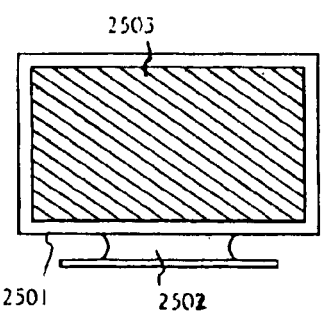

FIG. 16F is an EL display, containing a casing 2501, a support stand 2502, and a display portion 2503. The present invention can be used in the display portion 2503. The EL display of the present invention is especially advantageous for cases in which the screen is made large, and is favorable for displays having a diagonal greater than or equal to 10 inches (especially one which is greater than or equal to 30 inches).

Furthermore, if the emission luminance of EL materials becomes higher in future, then it will become possible to use the present invention in a front type or a rear type projector.

The above electronic devices are becoming more often used to display information provided through an electronic transmission circuit such as the Internet or CATV (cable television), and in particular, opportunities for displaying animation information are increasing. The response speed of EL materials is extremely high, and therefore EL displays are suitable for performing this type of display.

The emitting portion of the EL display device consumes power, and therefore it is preferable to display information so as to have the emitting portion become as small as possible. Therefore, when using the EL display device in a display portion which mainly displays character information, such as a portable information terminal,

[CHEM 1]

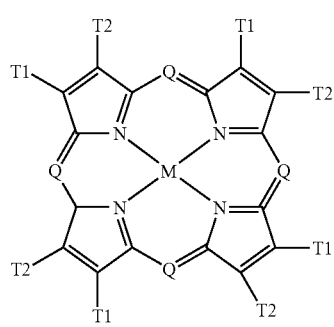

[CHEM 2]

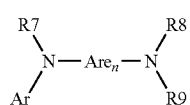

-continued

[CHEM 3]

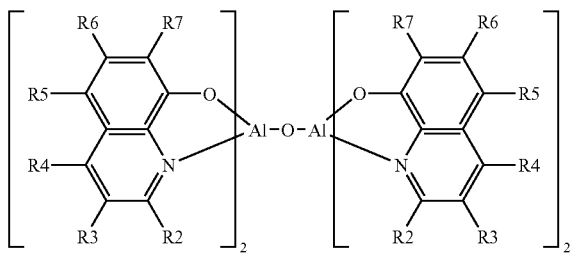

[CHEM 4]

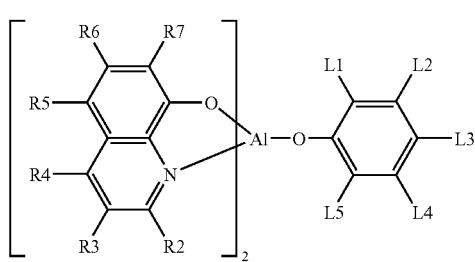

[CHEM 5]

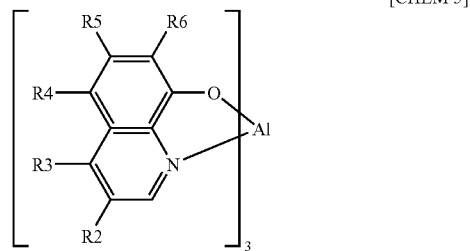

[CHEM 6]

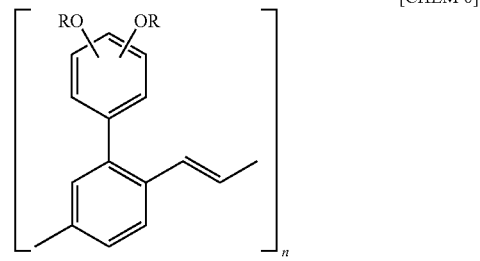

[CHEM 7]

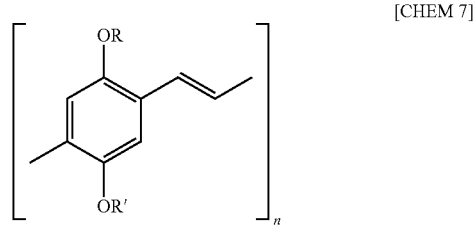

[CHEM 8]

[CHEM 9]

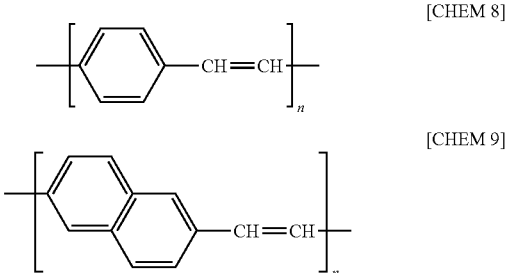

-continued

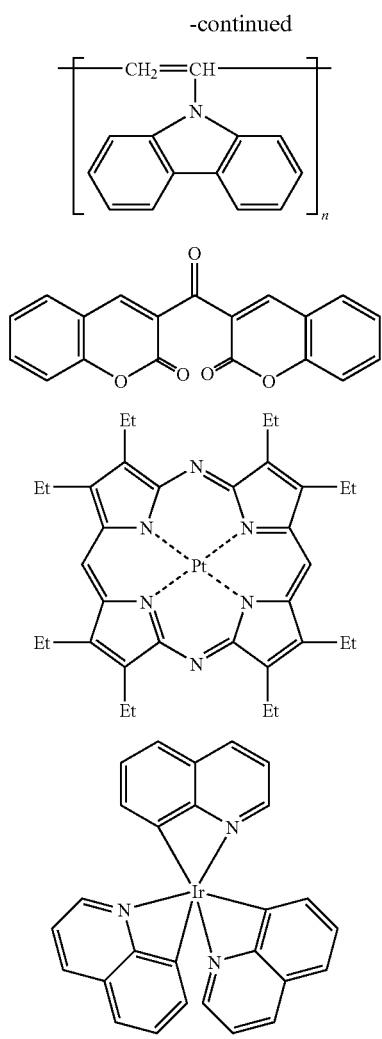

[CHEM 10]

[CHEM 11]

[CHEM 12]

[CHEM 13]

in particular, a portable telephone of a car audio system, it is preferable to drive it by setting non-emitting portions as background and forming character information in emitting portions.

Figure 22A:
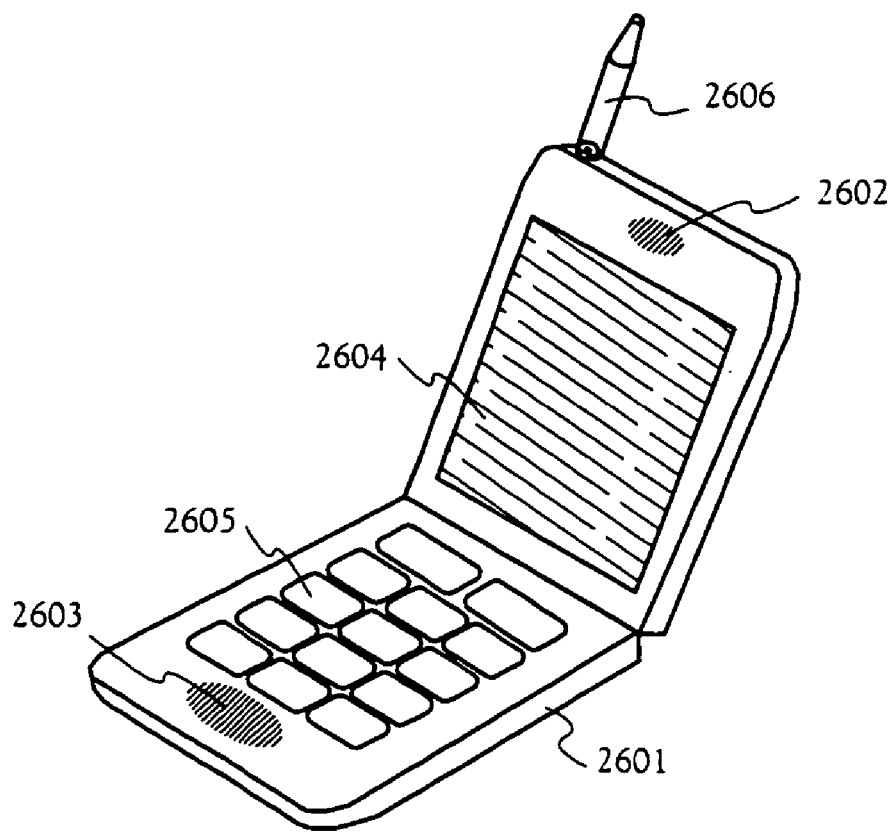
FIGS. 22A and 22B are diagrams showing specific examples of electronic devices of Embodiment 17.

FIG. 22A is a portable telephone, comprising a main body 2601, an audio output portion 2602, an audio input portion 2603, a display portion 2604, operation switches 2605, and an antenna 2606. The EL display device of the present invention can be used in the display portion 2604. Note that by displaying white characters in a black background in the display portion 2604, the power consumption of the portable telephone can be reduced.

Figure 22B:
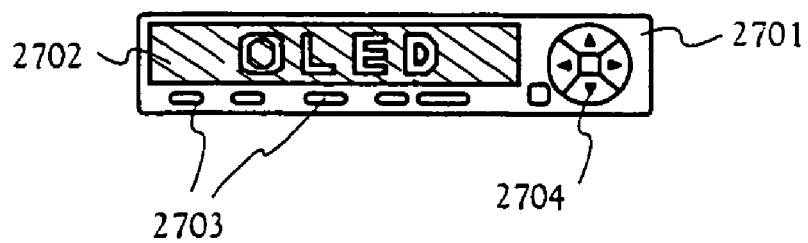

FIG. 22B is an on-board audio system (car audio system), containing a main body 2701, a display portion 2702, and operation switches 2703 and 2704. The EL display device of the present invention can be used in the display portion 2702. Furthermore, an on-board audio system is shown in embodiment 17, but a desktop type audio system may also be used. Note that by displaying white characters in a black background in the display portion 2702, the power consumption can be reduced.

The range of applications of the present invention is thus extremely wide, and it is possible to apply the present invention to electronic devices in all fields. Furthermore, the electronic devices of embodiment 17 can be realized by using any constitution of any combination of embodiments 1 to 16.

By using the present invention, it becomes possible to suppress degradation of EL elements due to moisture and heat. Further, the present invention can prevent imposing bad influence on TFT performance by diffusion of alkali metals from the EL layer. As a result, the operation performance and reliability can be greatly enhanced.

Moreover, it becomes possible to produce application products (electronic devices) having good image quality and durable (highly reliable) by comprising such EL display device as a display.

What is claimed is:

1. A light emitting device comprising:
    a substrate;
    a thin film transistor over the substrate;
    a first insulating film comprising an organic resin over the thin film transistor;
    a second insulating film formed over the first insulating film, the second insulating film comprising at least one selected from the group consisting of silicon nitride, aluminum oxide, aluminum nitride, nitrated aluminum oxide and diamond like carbon;
    a first electrode electrically connected to the thin film transistor, over the second insulating film;
    a bank over the second insulating film, the bank covering an edge of the first electrode;
    an EL layer disposed adjacent to a side edge of the bank, over the first electrode;
    a second electrode covering the bank and the EL layer; and
    a third insulating film covering the second electrode,
    wherein the EL layer does not extend beyond the side edge of the bank, and
    wherein the third insulating film comprises silicon nitride oxide film or a silicon nitride film.

2. The light emitting device according to claim 1, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

3. A light emitting device comprising:
    a substrate;
    a thin film transistor over the substrate;
    a first insulating film comprising an organic resin over the thin film transistor;
    a second insulating film formed over the first insulating film, the second insulating film comprising at least one selected from the group consisting of silicon nitride, aluminum oxide, aluminum nitride, nitrated aluminum oxide and diamond like carbon;
    a first electrode electrically connected to the thin film transistor, over the second insulating film;
    a bank over the second insulating film, the bank covering an edge of the first electrode;
    an EL layer disposed adjacent to a side edge of the bank, over the first electrode;
    a second electrode covering the bank and the EL layer; and
    a third insulating film covering the second electrode,
    wherein a side surface of the bank is in contact with a side edge of the EL layer, and
    wherein the EL layer does not extend beyond the side edge of the bank.

4. The light emitting device according to claim 3, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

5. A light emitting device comprising:
a substrate;
a thin film transistor over the substrate;
a first insulating film comprising an organic resin over the thin film transistor;
a second insulating film formed over the first insulating film, the second insulating film comprising at least one selected from the group consisting of silicon nitride, aluminum oxide, aluminum nitride, nitrated aluminum oxide and diamond like carbon;
a first electrode electrically connected to the thin film transistor, over the second insulating film;
a bank over the second insulating film, the bank covering an edge of the first electrode;
an EL layer disposed adjacent to a side edge of the bank, over the first electrode;
a second electrode covering the bank and the EL layer; and
a third insulating film covering the second electrode,
wherein the EL layer does not extend beyond the side edge of the bank.

6. The light emitting device according to claim 5, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

7. A light emitting device comprising:
a substrate;
a thin film transistor over the substrate;
a first insulating film comprising an organic resin over the thin film transistor;
a second insulating film formed over the first insulating film, the second insulating film comprising at least one selected from the group consisting of silicon nitride, aluminum oxide, aluminum nitride, nitrated aluminum oxide and diamond like carbon;
a first electrode electrically connected to the thin film transistor, over the second insulating film;
a bank over the second insulating film, the bank covering an edge of the first electrode;
an EL layer disposed adjacent to a side edge of the bank, over the first electrode;
a second electrode covering the bank and the EL layer; and
a third insulating film covering the second electrode,
wherein the EL layer comprises at least one layer selected from the group consisting of a light emitting layer, a hole injecting layer, a hole transporting layer, an electron injecting layer, and an electron transporting layer, and
wherein the EL layer does not extend beyond the side edge of the bank, and
wherein the third insulating film comprises silicon nitride oxide film or a silicon nitride film.

8. The light emitting device according to claim 7, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

9. A light emitting device comprising:
a substrate;
a thin film transistor over the substrate;
a first insulating film comprising an organic resin over the thin film transistor;
a second insulating film formed over the first insulating film, the second insulating film comprising at least one selected from the group consisting of silicon nitride, aluminum oxide, aluminum nitride, nitrated aluminum oxide and diamond like carbon;
a first electrode electrically connected to the thin film transistor, over the second insulating film;
a bank over the second insulating film, the bank covering an edge of the first electrode;
an EL layer disposed adjacent to a side edge of the bank, over the first electrode;
a second electrode covering the bank and the EL layer; and
a third insulating film covering the second electrode,
wherein the EL layer comprises at least one layer selected from the group consisting of a light emitting layer, a hole injecting layer, a hole transporting layer, an electron injecting layer, and an electron transporting layer,
wherein a side surface of the bank is in contact with a side edge of the EL layer, and
wherein the EL layer does not extend beyond the side edge of the bank.

10. The light emitting device according to claim 9, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

11. A light emitting device comprising:
a substrate;
a thin film transistor over the substrate;
a first insulating film comprising an organic resin over the thin film transistor;
a second insulating film formed over the first insulating film, the second insulating film comprising at least one selected from the group consisting of silicon nitride, aluminum oxide, aluminum nitride, nitrated aluminum oxide and diamond like carbon;
a first electrode electrically connected to the thin film transistor, over the second insulating film;
a bank over the second insulating film, the bank covering an edge of the first electrode;
an EL layer disposed adjacent to a side edge of the bank, over the first electrode;
a second electrode covering the bank and the EL layer; and
a third insulating film covering the second electrode,
wherein the EL layer comprises at least one layer selected from the group consisting of a light emitting layer, a hole injecting layer, a hole transporting layer, an electron injecting layer, and an electron transporting layer, and
wherein the EL layer does not extend beyond the side edge of the bank.

12. The light emitting device according to claim 11, wherein the light emitting device is incorporated into an electronic device selected from the group consisting of a video camera, a digital camera, a goggle type display, a car navigation system, a personal computer, a mobile computer, a mobile telephone, an electronic book, an image playback device, and a car audio system.

* * * * *